US012580020B2

(12) United States Patent
Sakaguchi

(10) Patent No.: US 12,580,020 B2
(45) Date of Patent: Mar. 17, 2026

(54) SEMICONDUCTOR MEMORY DEVICE

(71) Applicant: Kioxia Corporation, Tokyo (JP)

(72) Inventor: Takeshi Sakaguchi, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 297 days.

(21) Appl. No.: 18/460,325

(22) Filed: Sep. 1, 2023

(65) Prior Publication Data

US 2024/0203495 A1      Jun. 20, 2024

(30) Foreign Application Priority Data

Dec. 19, 2022    (JP) ................................. 2022-202059

(51) Int. Cl.
| | |
|---|---|
| *G11C 16/04* | (2006.01) |
| *H10B 41/10* | (2023.01) |
| *H10B 41/27* | (2023.01) |
| *H10B 41/35* | (2023.01) |
| *H10B 43/10* | (2023.01) |
| *H10B 43/27* | (2023.01) |
| *H10B 43/35* | (2023.01) |

(52) U.S. Cl.
CPC ......... *G11C 16/0483* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search
CPC ........ H10B 41/10; H10B 41/27; H10B 41/35; H10B 43/10; H10B 43/27; H10B 43/35; H10B 43/40; H10B 43/50
See application file for complete search history.

(56) References Cited

U.S. PATENT DOCUMENTS

| | | | | |
|---|---|---|---|---|
| 9,461,162 B2 * | 10/2016 | Lee | ...................... | H10B 12/033 |
| 10,748,927 B1 | 8/2020 | Tsutsumi et al. | | |
| 11,462,566 B2 * | 10/2022 | Lee | ........................ | H10B 41/27 |
| 12,046,302 B2 * | 7/2024 | Yang | .................. | G11C 16/3459 |

(Continued)

*Primary Examiner* — Alexander G Ghyka

(74) *Attorney, Agent, or Firm* — Foley & Lardner LLP

(57) ABSTRACT

A semiconductor memory device includes a first semiconductor layer, a first gate electrode layer, a second gate electrode layer including a first region and a second region that is separated from the first region, the first semiconductor layer being provided between the first region and the second region, a third gate electrode layer that is provided between the first gate electrode layer and the second gate electrode layer, and includes a third region and a fourth region that is separated from the third region, the first semiconductor layer being provided between the third region and the fourth region, a first charge storage layer provided between the first semiconductor layer and the first gate electrode layer, and having an annular shape, a second charge storage layer provided between the first semiconductor layer and the second region, and having a horseshoe shape, and a third charge storage layer provided between the first semiconductor layer and the fourth region, and having a horseshoe shape. A first distance from an end of the second region to an end of the second charge storage layer is greater than a second distance from an end of the fourth region to an end of the third charge storage layer.

15 Claims, 23 Drawing Sheets

(56) References Cited

U.S. PATENT DOCUMENTS

| | | | | |
|---|---|---|---|---|
| 2020/0075621 | A1 | 3/2020 | Nakaki | |
| 2020/0075625 | A1 | 3/2020 | Kobayashi et al. | |
| 2020/0143876 | A1* | 5/2020 | Nakamura | H10B 10/12 |
| 2020/0251488 | A1 | 8/2020 | Iwai et al. | |
| 2020/0251489 | A1 | 8/2020 | Tsutsumi et al. | |
| 2020/0294554 | A1* | 9/2020 | Kakegawa | H10B 41/10 |
| 2020/0373326 | A1* | 11/2020 | Nishikawa | G11C 16/10 |
| 2020/0402999 | A1 | 12/2020 | Nakaki | |
| 2022/0085050 | A1 | 3/2022 | Nakaki | |
| 2022/0278215 | A1 | 9/2022 | Shimojo | |
| 2022/0285391 | A1 | 9/2022 | Yamabe et al. | |
| 2023/0345725 | A1* | 10/2023 | Lee | G11C 13/0069 |
| 2024/0064986 | A1 | 2/2024 | Nakaki et al. | |

* cited by examiner

REGION Y1

REGION Y2

THIRD
DIRECTION

FIRST
DIRECTION

SGDL2
SGDL1
SGDL0
DWL2
DWL1
DWL0
WL12
WL11
WL10
WL9
22
WL8
WL7
WL6
WL5
WL4
WL3
WL2
WL1
WL0
SGS
CSL
12
10

THIRD
DIRECTION

SECOND
DIRECTION

SGD01        24        SGD02

THIRD
DIRECTION

SECOND
DIRECTION

DWL21        24        DWL22

20
16a
17
18c
19

SEMICONDUCTOR MEMORY DEVICE

CROSS-REFERENCE TO RELATED APPLICATION(S)

This application is based upon and claims the benefit of priority from Japanese Patent Application No. 2022-202059, filed Dec. 19, 2022, the entire contents of which are incorporated herein by reference.

FIELD

Embodiments described herein relate generally to a semiconductor memory device.

BACKGROUND

A three-dimensional NAND flash memory in which memory cells are located three-dimensionally achieves high integration and low cost. High reliability is required for the three-dimensional NAND flash memory.

DESCRIPTION OF THE DRAWINGS

FIGS. 21A and 21B are explanatory diagrams of a problem that a semiconductor memory device of the third comparative example has.

DETAILED DESCRIPTION

Figure 1:
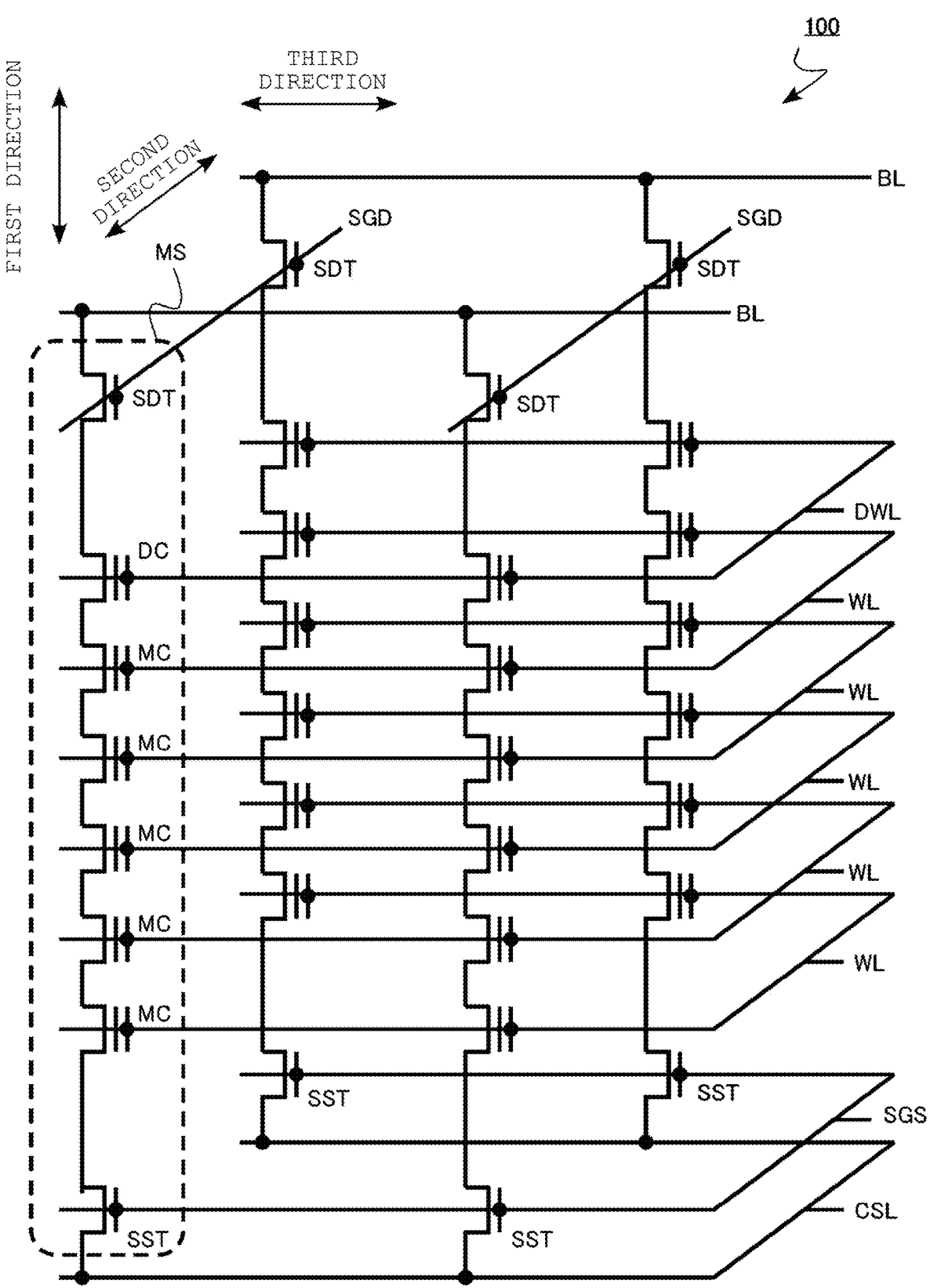
FIG. 1 is a circuit diagram of a memory cell array of a semiconductor memory device according to an embodiment.

Embodiments provide a semiconductor memory device with improved reliability.

In general, according to at least one embodiment, there is provided a semiconductor memory device including: a stacked body in which a plurality of first insulating layers and a plurality of gate electrode layers are alternately stacked in a first direction; a first semiconductor layer provided in the stacked body and extending in the first direction; a first gate electrode layer that is one of the plurality of gate electrode layers; a second gate electrode layer that is another one of the plurality of gate electrode layers, the second gate electrode layer including a first region extending in a second direction orthogonal to the first direction, and a second region that is separated from the first region and extends in the second direction, the first semiconductor layer being provided between the first region and the second region; a third gate electrode layer that is still another one of the plurality of gate electrode layers and is provided between the first gate electrode layer and the second gate electrode layer, the third gate electrode layer including a third region extending in the second direction, and a fourth region that is separated from the third region and extends in the second direction, the first semiconductor layer being provided between the third region and the fourth region; a first charge storage layer provided between the first semiconductor layer and the first gate electrode layer, and having an annular shape on a first plane perpendicular to the first direction and including the first gate electrode layer; a second charge storage layer provided between the first semiconductor layer and the second region, and having a horseshoe shape on a second plane perpendicular to the first direction and including the second gate electrode layer; and a third charge storage layer provided between the first semiconductor layer and the fourth region, and having a horseshoe shape on a third plane perpendicular to the first direction and including the third gate electrode layer, in which a distance in a third direction perpendicular to the first direction and the second direction between the first region and the second charge storage layer is greater than a distance in the third direction between the first region and the second region, a distance in the third direction between the third region and the third charge storage layer is equal to or greater than a distance in the third direction between the third region and the fourth region, and a first distance in the third direction from an end of the second region on the first region side to an end of the second charge storage layer on the first region side is greater than a second distance in the third direction from an end of the fourth region on the third region side to an end of the third charge storage layer on the third region side.

Embodiments will be described below with reference to the drawings. In the following description, the same or similar members are denoted by the same reference numerals, and descriptions of members that have already been described are omitted as appropriate.

Further, in this specification, the terms "upper" and "lower" may be used for convenience. "Upper" and "lower" are terms that only indicate a relative positional relationship in the drawing, and are not terms that define a positional relationship with respect to gravity.

The qualitative analysis and quantitative analysis of the chemical composition of the members constituting the semiconductor memory device in this specification may be performed by, for example, secondary ion mass spectroscopy (SIMS) and energy dispersive X-ray spectroscopy (EDX). In addition, for measuring the thickness of the members constituting the semiconductor memory device, the distance between the members, and the like, for example, an image acquired by a scanning electron microscope (SEM) or a transmission electron microscope (TEM) may be used.

A semiconductor memory device according to an embodiment includes: a stacked body in which a plurality of first insulating layers and a plurality of gate electrode layers are alternately stacked in a first direction; a first semiconductor layer provided in the stacked body and extending in the first direction; a first gate electrode layer that is one of the plurality of gate electrode layers; a second gate electrode layer that is another one of the plurality of gate electrode layers, the second gate electrode layer including a first region extending in a second direction orthogonal to the first direction, and a second region that is separated from the first region and extends in the second direction, the first semiconductor layer being provided between the first region and the second region; a third gate electrode layer that is still another one of the plurality of gate electrode layers and is provided between the first gate electrode layer and the second gate electrode layer, the third gate electrode layer including a third region extending in the second direction, and a fourth region that is separated from the third region and extends in the second direction, the first semiconductor layer being provided between the third region and the fourth region; a first charge storage layer provided between the first semiconductor layer and the first gate electrode layer, and having an annular shape on a first plane perpendicular to the first direction and including the first gate electrode layer; a second charge storage layer provided between the first semiconductor layer and the second region, and having a horseshoe shape on a second plane perpendicular to the first direction and including the second gate electrode layer; and a third charge storage layer provided between the first semiconductor layer and the fourth region, and having a horseshoe shape on a third plane perpendicular to the first direction and including the third gate electrode layer. Then, a distance in a third direction perpendicular to the first direction and the second direction between the first region and the second charge storage layer is greater than a distance in the third direction between the first region and the second region, a distance in the third direction between the third region and the third charge storage layer is equal to or greater than a distance in the third direction between the third region and the fourth region, and a first distance in the third direction from an end of the second region on the first region side to an end of the second charge storage layer on the first region side is greater than a second distance in the third direction from an end of the fourth region on the third region side to an end of the third charge storage layer on the third region side.

A semiconductor memory device of an embodiment is a three-dimensional NAND flash memory. In the semiconductor memory device of the embodiment, the charge storage layer of the memory cell MC is an insulating film. The memory cell MC of the semiconductor memory device of the embodiment is a so-called Metal-Oxide-Nitride-Oxide-Semiconductor type (MONOS type) memory cell.

FIG. 1 is a circuit diagram of a memory cell array of a semiconductor memory device according to an embodiment.

The memory cell array 100 of the three-dimensional NAND flash memory of the embodiment includes a plurality of word lines WL, a dummy word line DWL, a common source line CSL, a source select gate line SGS, a plurality of drain select gate lines SGD, a plurality of bit lines BL, and a plurality of memory strings MS, as shown in FIG. 1.

The plurality of word lines WL are stacked in a first direction. A plurality of memory strings MS extend in the first direction. A plurality of drain select gate lines SGD extend, for example, in a second direction perpendicular to the first direction. Further, the plurality of bit lines BL extend, for example, in a third direction perpendicular to the first direction and the second direction.

As shown in FIG. 1, the memory string MS includes a source select transistor SST, a plurality of memory cells MC, and a drain select transistor SDT, which are connected in series between the common source line CSL and the bit line BL. One memory string MS is selected by selecting one bit line BL and one drain select gate line SGD, and one memory cell MC can be selected by selecting one word line WL. Further, one memory string MS is selected by selecting one bit line BL and one drain select gate line SGD, and one dummy cell DC can be selected by selecting one dummy word line DWL.

It should be noted that the dummy cell DC does not function as the memory cell MC for storing data.

The word line WL is a gate electrode of a transistor forming the memory cell MC. The drain select gate line SGD is the gate electrode of the drain select transistor SDT. The dummy word line DWL is a gate electrode of a transistor forming the dummy cell DC.

It should be noted that the number of the plurality of word lines WL is not limited to five shown in FIG. 1. It should be noted that the number of dummy word lines DWL is not limited to one shown in FIG. 1. It should be noted that the number of source select gate lines SGS is not limited to one shown in FIG. 1. It should be noted that the number of the plurality of drain select gate lines SGD is not limited to two shown in FIG. 1. It should be noted that the number of the plurality of bit lines BL is not limited to two shown in FIG. 1.

Figure 2:
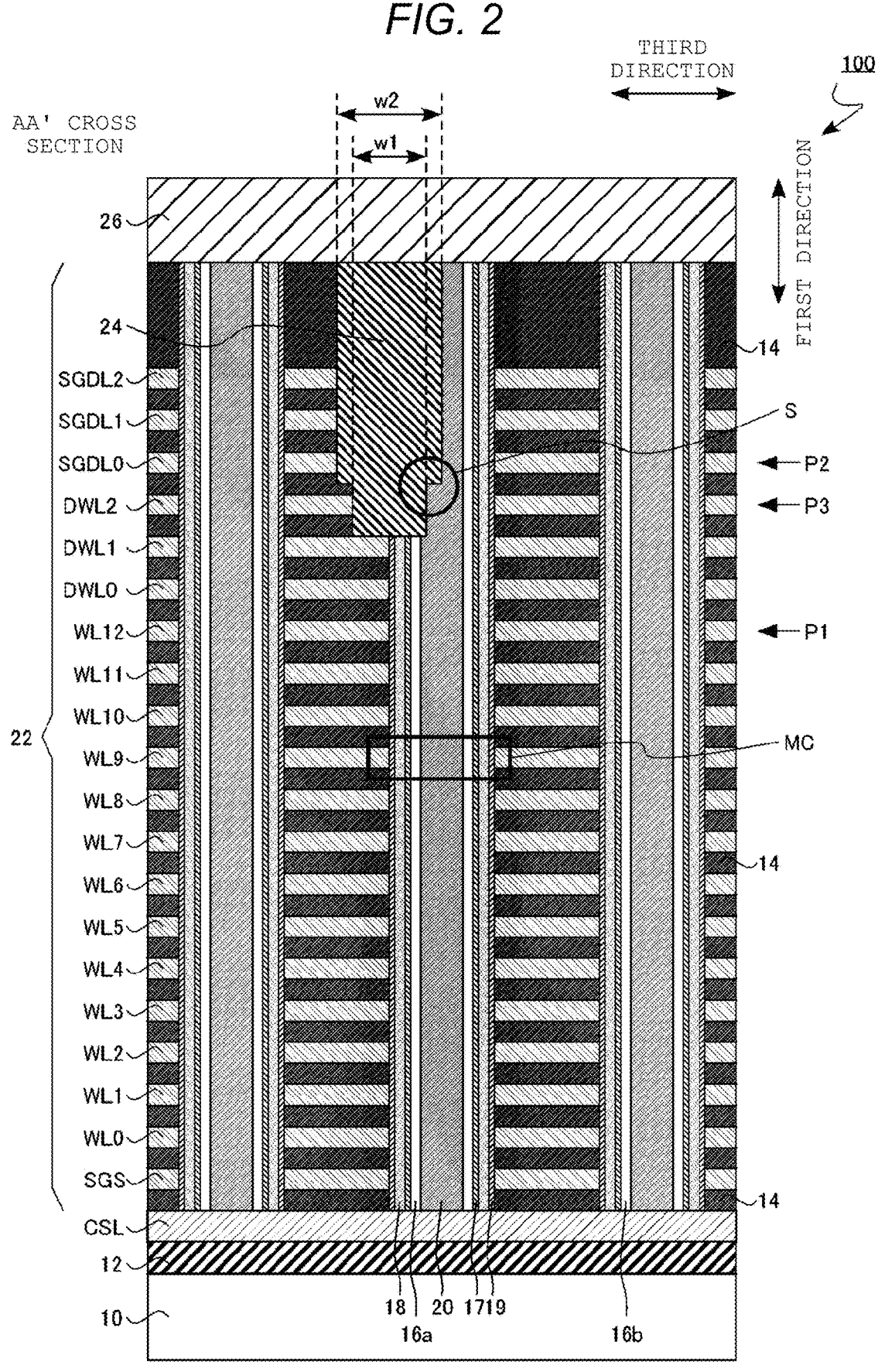
FIG. 2 is a schematic diagram of part of the memory cell array of the semiconductor memory device according to the embodiment.
Figure 3:
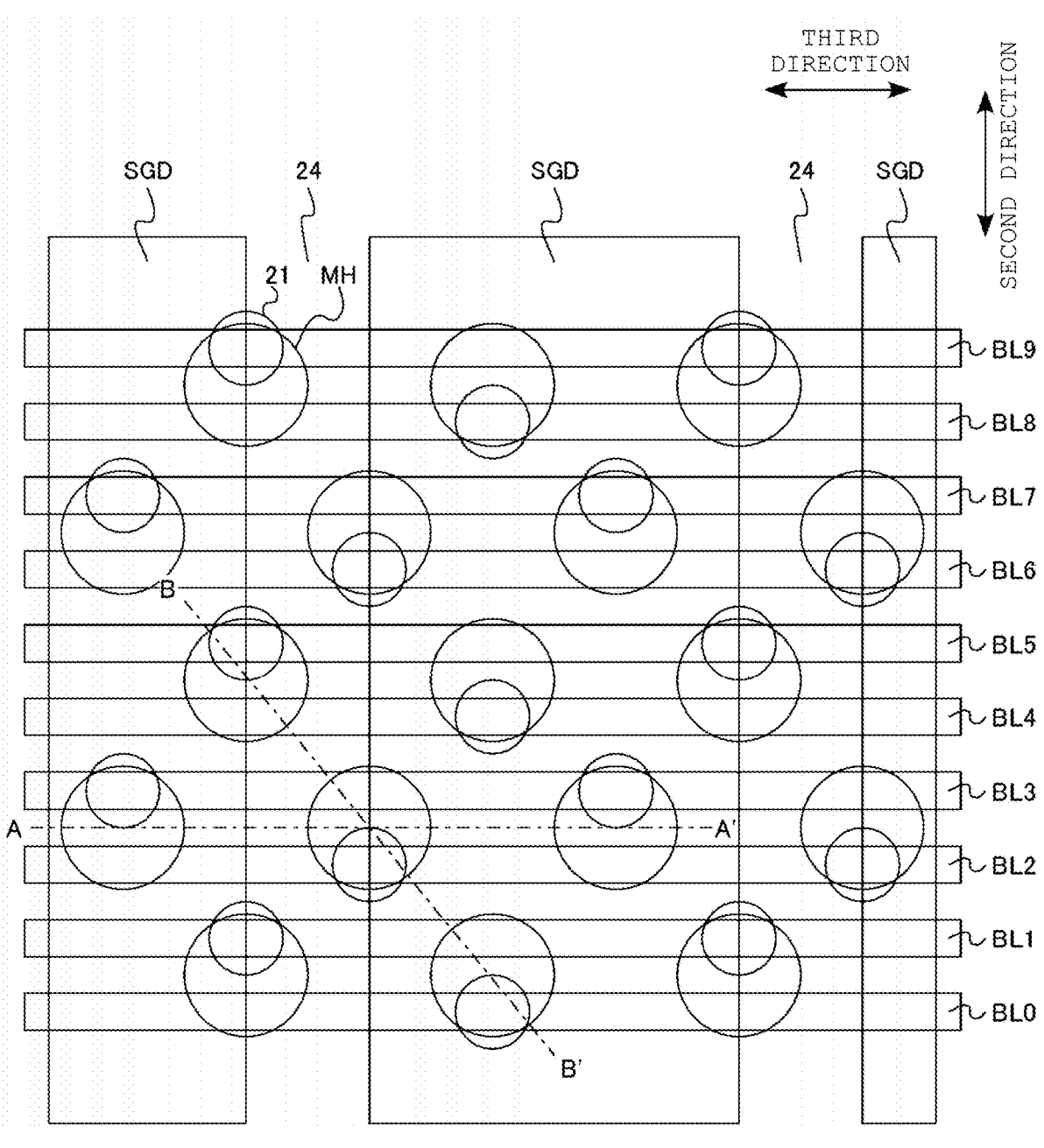
FIG. 3 is a schematic diagram of part of the memory cell array of the semiconductor memory device according to the embodiment.

FIGS. 2, 3, 4, 5, 6, and 7 are schematic diagrams of part of the memory cell array of the semiconductor memory device according to the embodiment. FIGS. 2 and 4 to 7 are cross-sectional views, and FIG. 3 is a top view.

FIG. 2 is a cross-sectional view of the memory cell array 100 parallel to the first direction and the third direction. FIG. 2 is an AA' cross section of FIGS. 3, 5, 6, and 7. In FIG. 2, a region surrounded by a rectangle is one memory cell MC.

FIG. 3 is a top view of the memory cell array 100. FIG. 3 is a diagram showing a layout pattern of the memory cell array 100. FIG. 3 shows patterns of memory holes MH and contact plugs 21.

Figure 4:
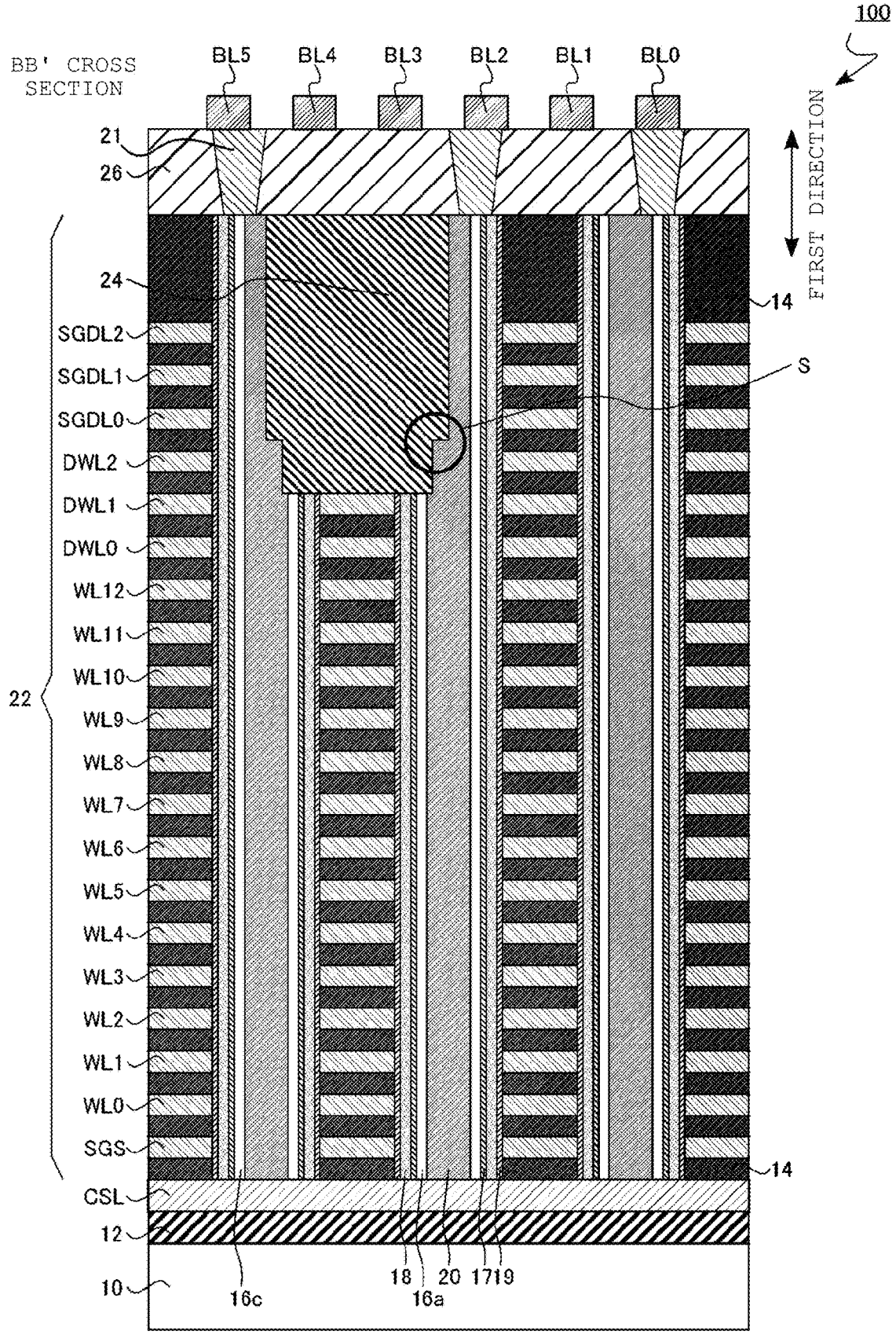
FIG. 4 is a schematic diagram of part of the memory cell array of the semiconductor memory device according to the embodiment.

FIG. 4 is a cross-sectional view of the memory cell array 100 parallel to the first direction and the third direction. FIG. 4 is a BB' cross section of FIGS. 3, 5, 6, and 7.

Figure 5:
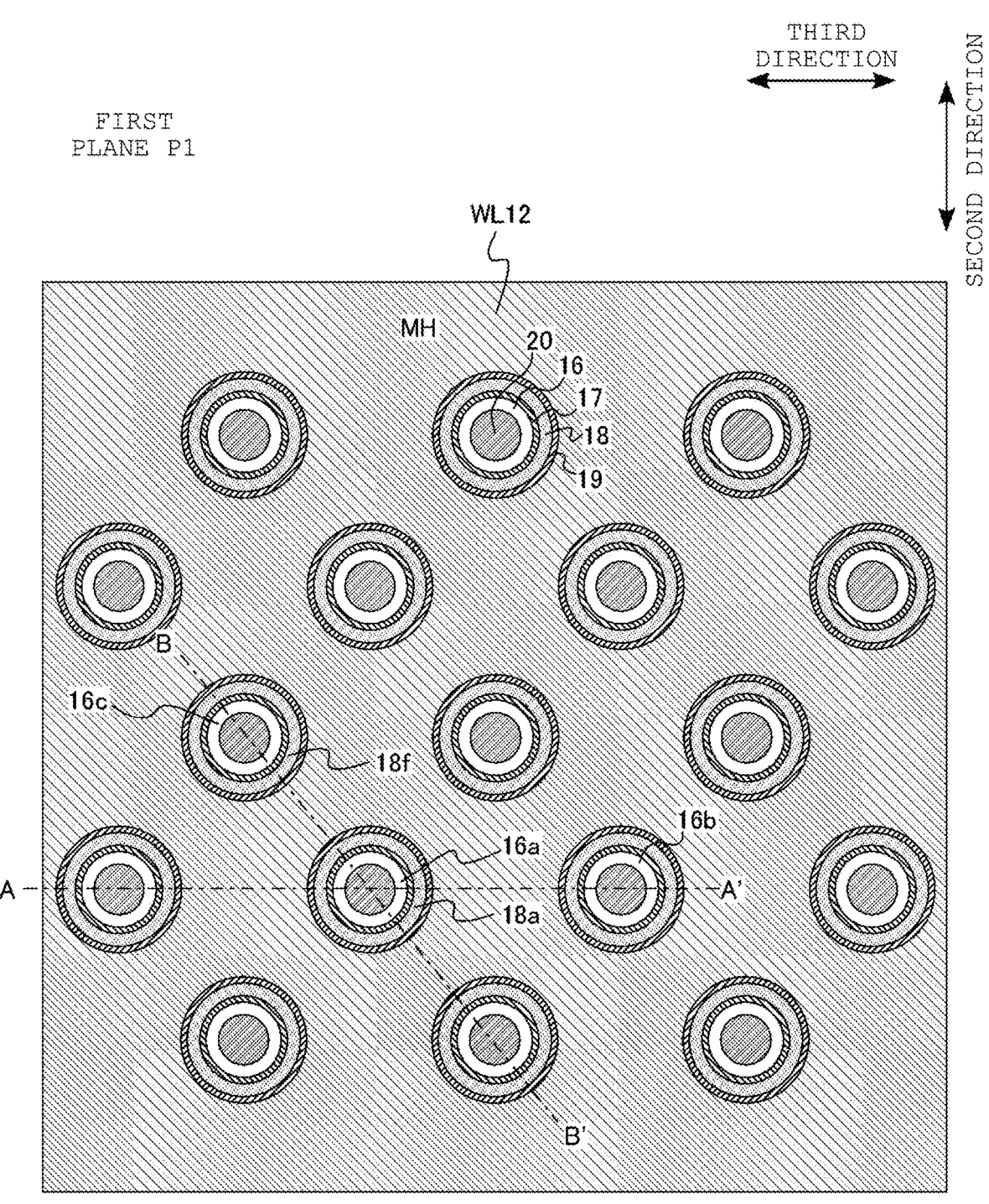
FIG. 5 is a schematic diagram of part of the memory cell array of the semiconductor memory device according to the embodiment.

FIG. 5 is a cross-sectional view of the memory cell array 100 perpendicular to the first direction. FIG. 5 is a cross section of FIG. 1 on a first plane P1.

Figure 6:
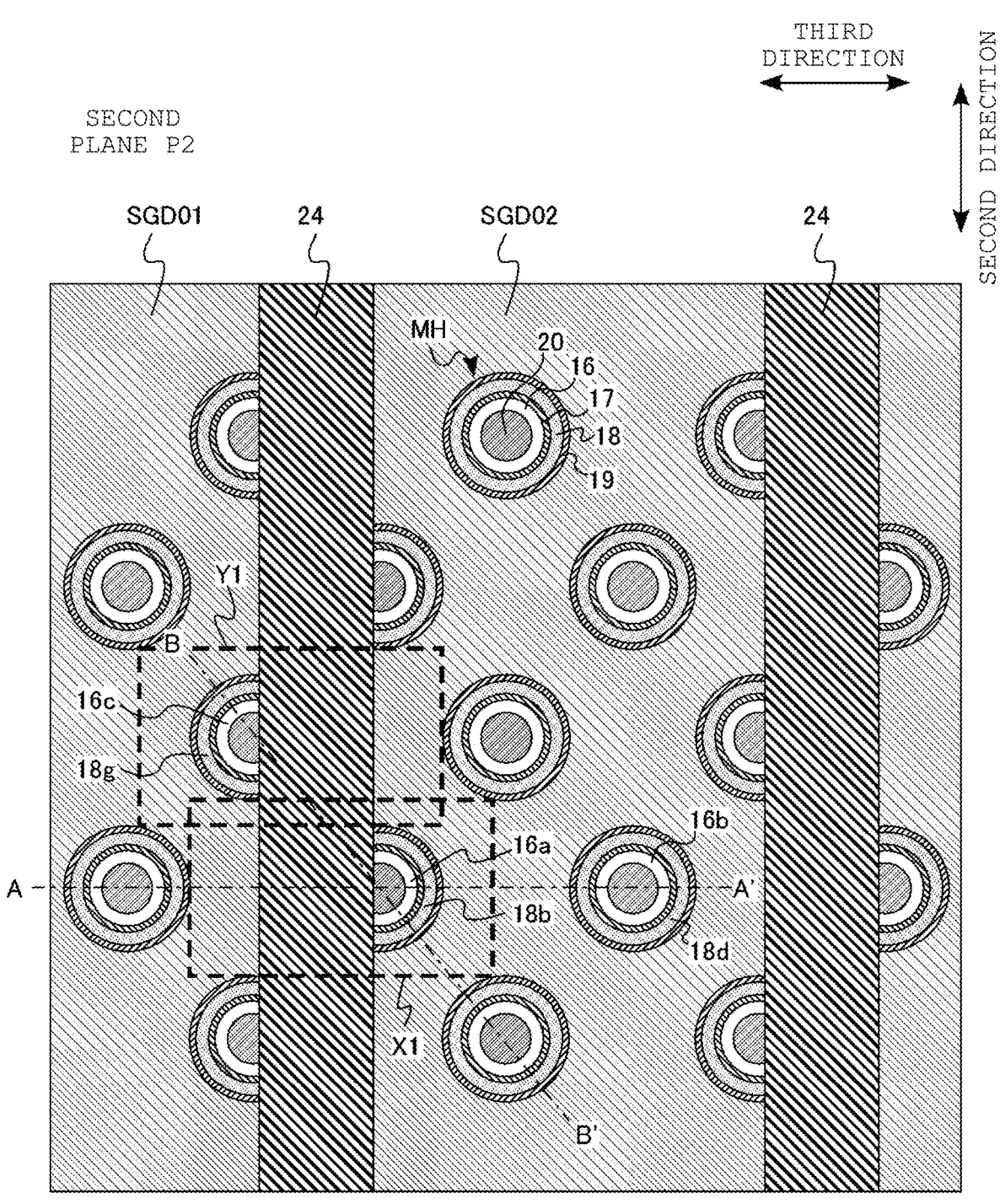
FIG. 6 is a schematic diagram of part of the memory cell array of the semiconductor memory device according to the embodiment.

FIG. 6 is a cross-sectional view of the memory cell array 100 perpendicular to the first direction. FIG. 6 is a cross section of FIG. 1 on a second plane P2.

Figure 7:
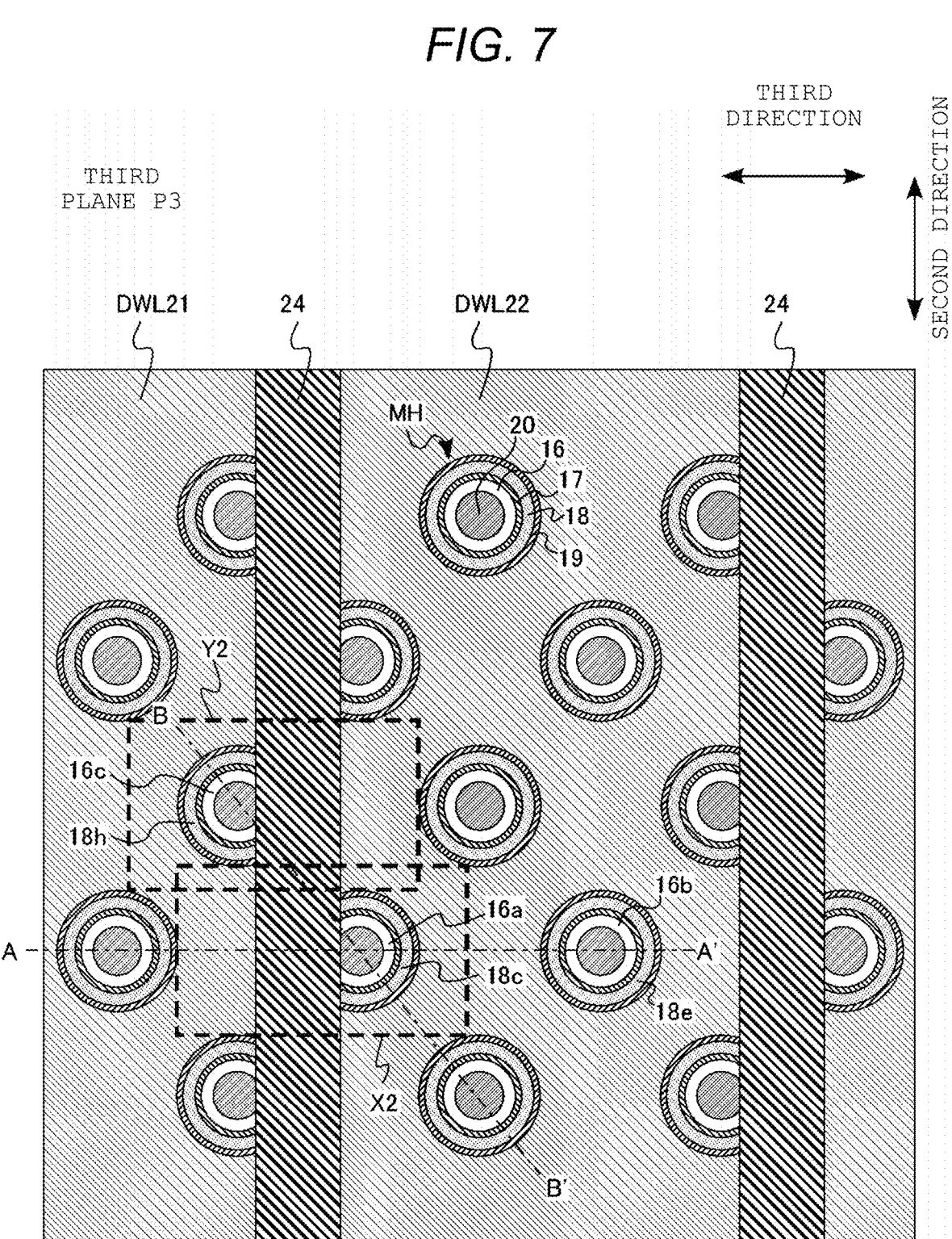
FIG. 7 is a schematic diagram of part of the memory cell array of the semiconductor memory device according to the embodiment.

FIG. 7 is a cross-sectional view of the memory cell array 100 perpendicular to the first direction. FIG. 7 is a cross section of FIG. 1 on a third plane P3.

As shown in FIGS. 2 to 7, the memory cell array 100 includes a semiconductor substrate 10, a substrate insulating layer 12, a common source line CSL, a source select gate line SGS, a plurality of drain select gate line layers SGDL, a plurality of word lines WL, a plurality of dummy word lines DWL, a plurality of interlayer insulating layers 14, a plurality of semiconductor layers 16, a plurality of tunnel insulating layers 17, a plurality of charge storage layers 18, a plurality of block insulating layers 19, a core insulating layer 20, a plurality of contact plugs 21, a stacked body 22, an isolation insulating layer 24, an upper insulating layer 26, and a plurality of bit lines BL.

The interlayer insulating layer 14 is an example of a first insulating layer. The isolation insulating layer 24 is an example of a second insulating layer.

The stacked body 22 includes the source select gate line SGS, the plurality of word lines WL, the plurality of dummy word lines DWL, the plurality of drain select gate line layers SGDL, and the plurality of interlayer insulating layers 14.

The word line WL is an example of a gate electrode layer. The plurality of word lines WL include word lines WL0 to WL12. The word line WL12 is an example of a first gate electrode layer. The drain select gate line layer SGDL is an example of a gate electrode layer. The plurality of drain select gate line layers SGDL include drain select gate line layers SGDL0 to SGDL2. The drain select gate line layer SGDL0 is an example of a second gate electrode layer.

Each drain select gate line layer SGDL includes a plurality of electrically isolated drain select gate lines SGD. The drain select gate line layer SGDL0 includes a first drain select gate line SGD01 and a second drain select gate line SGD02. The first drain select gate line SGD01 is an example of the first region. The second drain select gate line SGD02 is an example of the second region.

The dummy word line DWL is an example of a gate electrode layer. The plurality of dummy word lines DWL include dummy word lines DWL0 to DWL2. The dummy word line DWL2 is an example of a third gate electrode layer. The dummy word line DWL2 has a third region DWL21 and a fourth region DWL22.

The plurality of semiconductor layers 16 include a first semiconductor layer 16a, a second semiconductor layer 16b, and a third semiconductor layer 16c. The plurality of charge storage layers 18 include a first charge storage layer 18a, a second charge storage layer 18b, a third charge storage layer 18c, a fourth charge storage layer 18d, a fifth charge storage layer 18e, a sixth charge storage layer 18f, a seventh charge storage layer 18g, and an eighth charge storage layer 18h.

The plurality of bit lines BL include bit lines BL0 to BL9. Bit line BL2 is an example of a first conductive layer.

The semiconductor substrate 10 is, for example, a silicon substrate.

The substrate insulating layer 12 is provided on the semiconductor substrate 10. The substrate insulating layer 12 is, for example, silicon oxide.

The common source line CSL is provided on the substrate insulating layer 12. The common source line CSL is, for example, metal or semiconductor.

The stacked body 22 is provided on the common source line CSL.

The interlayer insulating layers 14 and the source select gate line SGS, the word lines WL, the dummy word lines DWL, or the drain select gate line layers SGDL are alternately stacked on the semiconductor substrate 10 in the first direction. Among the source select gate line SGS, the word lines WL, the dummy word lines DWL, and the drain select gate line layers SGDL stacked in the first direction, the layer closest to the semiconductor substrate 10 is the source select gate line SGS, and the layer farthest from the semiconductor substrate 10 is the drain select gate line layer SGDL. The word line WL is provided between the source select gate line SGS and the drain select gate line layer SGDL. The dummy word line DWL is provided between the word line WL and the drain select gate line layer SGDL.

The word lines WL, the dummy word lines DWL, and the drain select gate line layers SGDL are plate-shaped electric conductors, for example. The word lines WL, the dummy word lines DWL, and the drain select gate line layers SGDL contain metal, metal nitride, metal carbide, or semiconductor, for example. For example, tungsten (W), titanium (Ti), tantalum (Ta), and molybdenum (Mo) may be used as the metal. Polycrystalline silicon, for example, may be used as the semiconductor. The word lines WL, the dummy word lines DWL, and the drain select gate line layers SGDL may contain a barrier metal such as titanium nitride or tantalum nitride.

The word line WL is a gate electrode of a transistor forming the memory cell MC. The word line WL functions as the control electrode of the transistor of the memory cell MC.

The word lines WL include word lines WL0 to WL12. The word line WL is an example of a gate electrode layer. The word line WL12 is an example of a first gate electrode layer.

The drain select gate line layer SGDL is divided into a plurality of drain select gate lines SGD extending in a second direction perpendicular to the first direction. The drain select gate line SGD is the gate electrode of the drain select transistor SDT. The drain select gate line SGD functions as a control electrode of the drain select transistor SDT.

The drain select gate line layer SGDL is an example of a gate electrode layer. The drain select gate line layer SGDL includes drain select gate line layers SGDL0 to SGDL2. The drain select gate line layer SGDL0 is an example of a second gate electrode layer.

The drain select gate line layer SGDL0 includes a first drain select gate line SGD01 and a second drain select gate line SGD02. The first drain select gate line SGD01 is an example of the first region. The second drain select gate line SGD02 is an example of the second region.

The first drain select gate line SGD01 and the second drain select gate line SGD02 extend in the second direction.

The second drain select gate line SGD02 is provided in a third direction perpendicular to the first and second directions with respect to the first drain select gate line SGD01. The second drain select gate line SGD02 is separated in the third direction from the first drain select gate line SGD01.

The first drain select gate line SGD01 and the second drain select gate line SGD02 are electrically isolated. Different potentials may be applied to the first drain select gate line SGD01 and the second drain select gate line SGD02.

The dummy word line DWL is a gate electrode of a transistor forming the dummy cell DC. The dummy word line DWL functions as a control electrode of the transistor of the dummy cell DC.

The dummy word line DWL reduces the influence of the potential change of the drain select gate line SGD on the operation of the memory cell MC. Further, the dummy word lines DWL prevent the word lines WL from being affected by the manufacturing process when forming the drain select gate line SGD.

The dummy word line DWL2 is an example of a gate electrode layer. The dummy word lines DWL include dummy word lines DWL0 to DWL2. The dummy word line DWL2 is an example of a third gate electrode layer.

The dummy word lines DWL2 include a third region DWL21 and a fourth region DWL22. The third region DWL21 and the fourth region DWL22 extend in the second direction. The fourth region DWL22 is provided in the third direction with respect to the third region DWL21. The fourth region DWL22 is separated from the third region DWL21 in the third direction.

The third region DWL21 and the fourth region DWL22 are electrically connected. The third region DWL21 and the fourth region DWL22 have the same potential.

The interlayer insulating layer 14 separates the common source line CSL from the source select gate line SGS, the source select gate line SGS from the word line WL, the word line WL from the word line WL, the word line WL from the dummy word line DWL, and the dummy word line DWL from the drain select gate line layer SGDL. The interlayer insulating layer 14 is, for example, oxide, oxynitride, or nitride. The interlayer insulating layer 14 is, for example, silicon oxide.

The semiconductor layer 16 is provided in the stacked body 22. The semiconductor layer 16 extends in the first direction. The semiconductor layer 16 is provided in the memory hole MH formed in the stacked body 22. The direction in which the semiconductor layer 16 extends may not necessarily match the first direction completely. For example, the extending direction of the semiconductor layer 16 may be within a range of ±5 degrees with respect to the first direction.

The semiconductor layers 16 include a first semiconductor layer 16a, a second semiconductor layer 16b, and a third semiconductor layer 16c.

A polycrystalline semiconductor, for example, is used for the semiconductor layer 16. Polycrystalline silicon, for example, is used as the polycrystalline semiconductor. The semiconductor layer 16 functions as a channel region of the transistor of the memory cell MC.

The charge storage layer 18 is provided in the stacked body 22. The charge storage layer 18 is provided between the semiconductor layer 16 and the word line WL, between the semiconductor layer 16 and the drain select gate line layer SGDL, and between the semiconductor layer 16 and the dummy word line DWL.

The charge storage layer 18 is provided in the memory hole MH formed in the stacked body 22. The charge storage layer 18 surrounds the semiconductor layer 16, for example.

The charge storage layers 18 include a first charge storage layer 18a, a second charge storage layer 18b, a third charge storage layer 18c, a fourth charge storage layer 18d, a fifth charge storage layer 18e, a sixth charge storage layer 18f, a seventh charge storage layer 18g, and an eighth charge storage layer 18h.

The first charge storage layer 18a is provided between the first semiconductor layer 16a and the word line WL12. The second charge storage layer 18b is provided between the first semiconductor layer 16a and the second drain select gate line SGD02 of the drain select gate line layer SGDL0. The third charge storage layer 18c is provided between the first semiconductor layer 16a and the fourth region DWL22 of the dummy word line DWL2. The fourth charge storage layer 18d is provided between the second semiconductor layer 16b and the second drain select gate line SGD02 of the drain select gate line layer SGDL0. The fifth charge storage layer 18e is provided between the second semiconductor layer 16b and the fourth region DWL22 of the dummy word line DWL2. The sixth charge storage layer 18f is provided between the third semiconductor layer 16c and the word line WL12. The seventh charge storage layer 18g is provided between the third semiconductor layer 16c and the first drain select gate line SGD01 of the drain select gate line layer SGDL0. The eighth charge storage layer 18h is provided between the third semiconductor layer 16c and the third region DWL21 of the dummy word line DWL2.

The charge storage layer 18 is, for example, an insulating layer or a conductive layer. The charge storage layer 18 is, for example, silicon nitride. The charge storage layer 18 is, for example, polycrystalline silicon. The charge storage layer 18 has a function of storing charges.

The charge storage layer 18 is provided along the side surface of the semiconductor layer 16. The charge storage layer 18 may or may not be provided between the semiconductor layer 16 and the interlayer insulating layer 14. The charge storage layer 18 may be continuous or separated between the memory cells MC adjacent in the first direction.

The tunnel insulating layer 17 is provided in the stacked body 22. The tunnel insulating layer 17 is provided between the semiconductor layer 16 and the charge storage layer 18. The tunnel insulating layer 17 is surrounded by, for example, the charge storage layer 18. Further, the tunnel insulating layer 17 surrounds the semiconductor layer 16, for example.

The tunnel insulating layer 17 is an insulating layer. The tunnel insulating layer 17 is, for example, silicon oxide. The tunnel insulating layer 17 has a function of selectively passing charges.

The block insulating layer 19 is provided in the stacked body 22. The block insulating layer 19 is provided between the charge storage layer 18 and the word line WL, between the charge storage layer 18 and the drain select gate line layer SGDL, and between the charge storage layer 18 and the dummy word line DWL. The block insulating layer 19 surrounds the charge storage layer 18, for example.

The block insulating layer 19 is an insulating layer. The block insulating layer 19 is, for example, silicon oxide or aluminum oxide. The block insulating layer 19 has a function of blocking current flowing between the charge storage layer 18 and the word line WL, between the charge storage layer 18 and the drain select gate line layer SGDL, or between the charge storage layer 18 and the dummy word line DWL.

The threshold voltage of the transistor of the memory cell MC changes according to the amount of charges stored in the charge storage layer 18. By using this change in threshold voltage, one memory cell MC can store data.

For example, when the threshold voltage of the transistor of the memory cell MC changes, the voltage at which the transistor turns on changes. For example, when a state with a high threshold voltage is defined as data "0" and a state with a low threshold voltage is defined as data "1", the memory cell MC can store 1-bit data of "0" and "1".

The core insulating layer 20 is provided in the stacked body 22. The core insulating layer 20 extends in a first direction. The core insulating layer 20 penetrates through the stacked body 22, for example. The core insulating layer 20 is surrounded by the semiconductor layer 16.

The core insulating layer 20 is an insulating layer. The core insulating layer 20 is, for example, an oxide, an oxynitride, or a nitride. The core insulating layer 20 is, for example, silicon oxide.

The isolation insulating layer 24 is provided in the stacked body 22. The isolation insulating layer 24 extends in the second direction.

The isolation insulating layer 24 is in contact with the drain select gate line layer SGDL. The isolation insulating layer 24 is in contact with at least part of the dummy word lines DWL. The isolation insulating layer 24 is isolated from the word line WL. The isolation insulating layer 24 is not in contact with the word line WL.

The isolation insulating layer 24 is provided, for example, between the first drain select gate line SGD01 and the second drain select gate line SGD02. The isolation insulating layer 24 is provided, for example, between the third region DWL21 and the fourth region DWL22.

As shown in FIG. 2, the side surface of the isolation insulating layer 24 has stepped portions S in planes parallel to the first direction and the third direction. The first width in the third direction (w1 in FIG. 2) of the isolation insulating layer 24 on the word line WL12 side of the stepped portion S is narrower than the second width in the third direction (w2 in FIG. 2) of the isolation insulating layer 24 on a drain select gate line layer SGDL0 side of the stepped portion S. The first width w1 is, for example, 30% or more and 80% or less of the second width w2.

The isolation insulating layer 24 is an insulating layer. The isolation insulating layer 24 is, for example, silicon oxide.

The isolation insulating layer 24 has a function of physically and electrically isolating the drain select gate lines SGD formed by dividing the drain select gate line layer SGDL. By dividing the drain select gate line layer SGDL by the isolation insulating layer 24 to form the drain select gate line SGD, one memory string MS can be selected from a plurality of memory strings MS connected to one bit line BL.

The upper insulating layer 26 is provided on the drain select gate line layer SGDL. The upper insulating layer 26 is an insulating layer. The upper insulating layer 26 is, for example, silicon oxide. The upper insulating layer 26 has, for example, a function of separating the drain select gate line layer SGDL and the bit line BL.

The bit line BL is provided on the stacked body 22. The bit line BL extends in the third direction. The bit line BL is electrically connected to the semiconductor layer 16. For example, the bit line BL2 is electrically connected to the first semiconductor layer 16a and the second semiconductor layer 16b.

The drain select gate line layer SGDL0 is provided between the bit line BL and the word line WL12.

The bit line BL is an electric conductor. The bit line BL includes, for example, metal, metal nitride, metal carbide, or semiconductor. For example, tungsten (W), titanium (Ti), and tantalum (Ta) may be used as the metal. Polycrystalline silicon, for example, may be used as the semiconductor. The bit line BL may include a barrier metal such as titanium nitride or tantalum nitride.

The contact plug 21 is provided in the upper insulating layer 26. The contact plug 21 extends in the first direction. The contact plug 21 is in contact with the semiconductor layer 16, for example. Further, the contact plug 21 is in contact with, for example, the bit line BL.

The contact plug 21 is an electric conductor. The contact plug 21 includes, for example, metal, metal nitride, metal carbide, or semiconductor. The contact plug 21 is, for example, tungsten.

The contact plug 21 has a function of electrically connecting the semiconductor layer 16 and the bit line BL.

As shown in FIG. 5, on a first plane P1, the first charge storage layer 18a is provided between the first semiconductor layer 16a and the word line WL12. The first charge storage layer 18a is annular on the first plane P1.

Further, as shown in FIG. 5, on the first plane P1, the sixth charge storage layer 18f is provided between the third semiconductor layer 16c and the word line WL12. The sixth charge storage layer 18f is annular on the first plane P1.

Further, as shown in FIG. 5, on the first plane P1, the first semiconductor layer 16a, the second semiconductor layer 16b, and the third semiconductor layer 16c are annular.

As shown in FIG. 6, on the second plane P2, the second charge storage layer 18b is provided between the first semiconductor layer 16a and the second drain select gate line SGD02 of the drain select gate line layer SGDL0. The second charge storage layer 18b has a horseshoe shape on the second plane P2.

The horseshoe shape is, in other words, a U shape. Further, the horseshoe shape is, in other words, a shape in which a part of the ring is missing.

The second charge storage layer 18b is cut by the isolation insulating layer 24 to have a horseshoe shape.

As shown in FIG. 6, on the second plane P2, the fourth charge storage layer 18d is provided between the second semiconductor layer 16b and the second drain select gate line SGD02 of the drain select gate line layer SGDL0. The fourth charge storage layer 18d is annular on the first plane P1.

The fourth charge storage layer 18d is not cut by the isolation insulating layer 24 and thus has an annular shape.

As shown in FIG. 6, on the second plane P2, the seventh charge storage layer 18g is provided between the third semiconductor layer 16c and the first drain select gate line SGD01 of the drain select gate line layer SGDL0. The seventh charge storage layer 18g has a horseshoe shape on the second plane P2.

The seventh charge storage layer 18g is cut by the isolation insulating layer 24 to have a horseshoe shape.

Further, as shown in FIG. 6, on the second plane P2, the first semiconductor layer 16a and the third semiconductor layer 16c are cut by the isolation insulating layer 24 to form a horseshoe shape. Meanwhile, the second semiconductor layer 16b is annular.

As shown in FIG. 7, on a third plane P3, the third charge storage layer 18c is provided between the first semiconductor layer 16a and the fourth region DWL22 of the dummy word line DWL2. The third charge storage layer 18c has a horseshoe shape on the third plane P3.

The third charge storage layer 18c is cut by the isolation insulating layer 24 to form a horseshoe shape.

As shown in FIG. 7, on the third plane P3, the fifth charge storage layer 18e is provided between the second semiconductor layer 16b and the fourth region DWL22 of the dummy word line DWL2. The fifth charge storage layer 18e is annular on the third plane P3.

Since the fifth charge storage layer 18e is not cut by the isolation insulating layer 24, it has an annular shape.

As shown in FIG. 7, on the third plane P3, the eighth charge storage layer 18h is provided between the third semiconductor layer 16c and the third region DWL21 of the dummy word line DWL2. The eighth charge storage layer 18h has a horseshoe shape on the third plane P3.

The eighth charge storage layer 18h is cut by the isolation insulating layer 24 to form a horseshoe shape.

Further, as shown in FIG. 7, on the third plane P3, the first semiconductor layer 16a and the third semiconductor layer 16c are cut by the isolation insulating layer 24 to form a horseshoe shape. Meanwhile, the second semiconductor layer 16b is annular.

As described above, among the semiconductor layers 16 extending in the first direction, a portion of the semiconductor layers 16 including the first semiconductor layer 16a and the third semiconductor layer 16c are cut by the isolation insulating layer 24 to form a horseshoe shape. However, any semiconductor layer 16 including the first semiconductor layer 16a and the third semiconductor layer 16c is connected to the bit line BL by the contact plug 21, as shown in FIG. 4. Therefore, any semiconductor layer 16 including the first semiconductor layer 16a and the third semiconductor layer 16c functions as a channel region of the memory string MS and contributes to the memory operation.

Figure 8A:
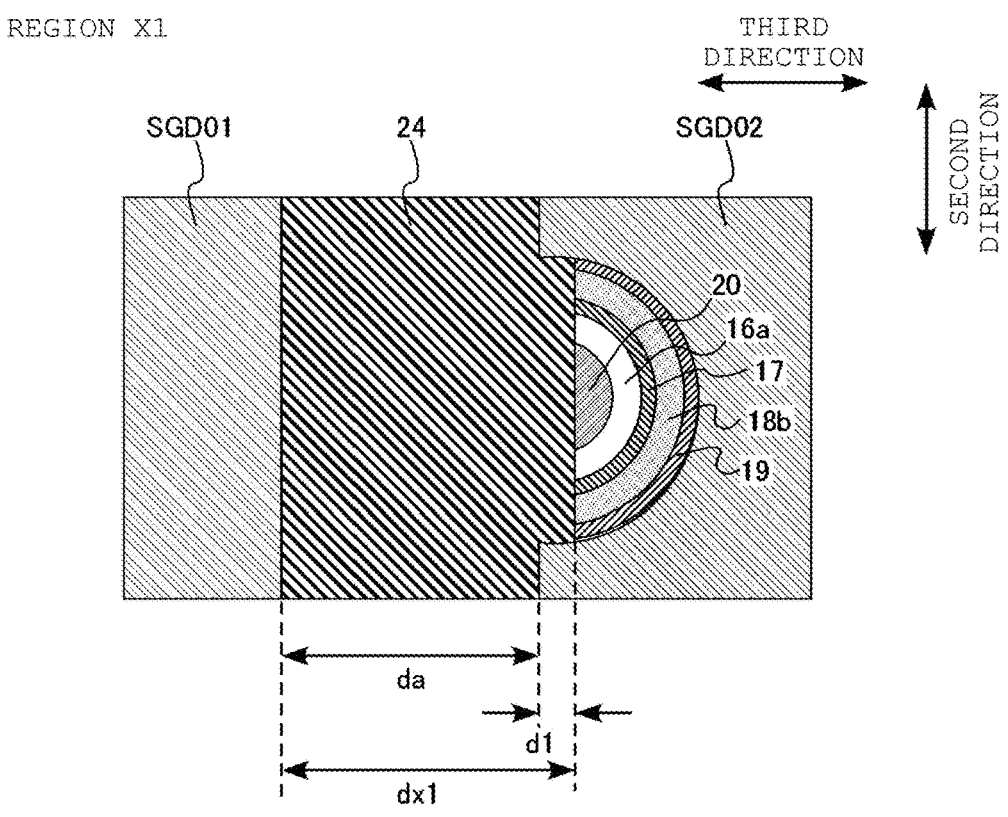
FIGS. 8A and 8B are enlarged schematic diagrams of part of the memory cell array of the semiconductor memory device according to the embodiment.
Figure 8B:
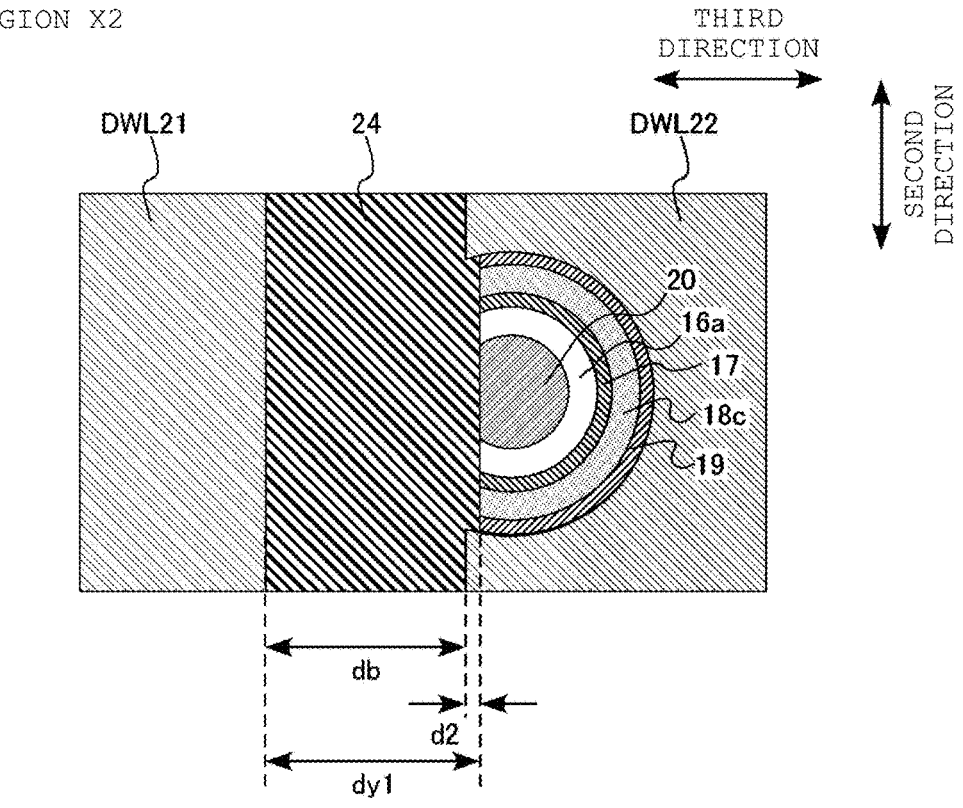

FIGS. 8A and 8B are enlarged schematic diagrams of part of a memory cell array of a semiconductor memory device according to the embodiment. FIGS. 8A and 8B are cross-sectional views of the memory cell array 100 perpendicular to the first direction. FIG. 8A is an enlarged view of a part of FIG. 6. FIG. 8A is a diagram corresponding to the region X1 in FIG. 6. FIG. 8B is an enlarged view of a part of FIG. 7. FIG. 8B is a diagram corresponding to the region X2 in FIG. 7.

As shown in FIG. 8A, the distance in the third direction (dx1 in FIG. 8A) between the first drain select gate line SGD01 and the second charge storage layer 18b is greater than the distance in the third direction (da in FIG. 8A) between the first drain select gate line SGD01 and the second drain select gate line SGD02. That is, the second charge storage layer 18b is recessed inward from the end of the second drain select gate line SGD02.

A distance dx1 in the third direction between the first drain select gate line SGD01 and the first semiconductor layer 16a is greater than a distance da in the third direction between the first drain select gate line SGD01 and the second drain select gate line SGD02. That is, the first semiconductor layer 16a is recessed inward from the end of the second drain select gate line SGD02.

As shown in FIG. 8B, the distance in the third direction (dy1 in FIG. 8B) between the third region DWL21 and the third charge storage layer 18c is equal to or greater than the distance in the third direction (db in FIG. 8B) between the third region DWL21 and the fourth region DWL22. That is, the third charge storage layer 18c is either flush with the end of the fourth region DWL22 or recessed inward from the end.

A distance dy1 in the third direction between the third region DWL21 and the first semiconductor layer 16a is equal to or greater than a distance db in the third direction between the third region DWL21 and the fourth region DWL22. That is, the first semiconductor layer 16a is either flush with the end of the fourth region DWL22 or recessed inward from the end.

Further, the first distance in the third direction (d1 in FIG. 8A) from the end of the second drain select gate line SGD02 on the first drain select gate line SGD01 side to the end of the second charge storage layer 18b on the first drain select gate line SGD01 side is greater than the second distance in the third direction (d2 in FIG. 8B) from the end of the fourth region DWL22 on the third region DWL21 side to the end of the third charge storage layer 18c on the third region DWL21 side.

The first distance d1 is, for example, 10 nm or more and 20 nm or less. The second distance d2 is, for example, 0 nm or more and 5 nm or less.

The first distance d1 is, for example, two to ten times the second distance d2.

Further, the distance in the third direction (d1 in FIG. 8A) from the end of the second drain select gate line SGD02 on the first drain select gate line SGD01 side to the end of the first semiconductor layer 16a on the first drain select gate line SGD01 side is greater than the second distance in the third direction (d2 in FIG. 8B) from the end of the fourth region DWL22 on the third region DWL21 side to the end of the first semiconductor layer 16a on the third region DWL21.

Further, the distance in the third direction (da in FIG. 8A) between the first drain select gate line SGD01 and the second drain select gate line SGD02 is greater than the distance in the third direction (db in FIG. 8B) between the third region DWL21 and the fourth region DWL22.

Figure 9A:
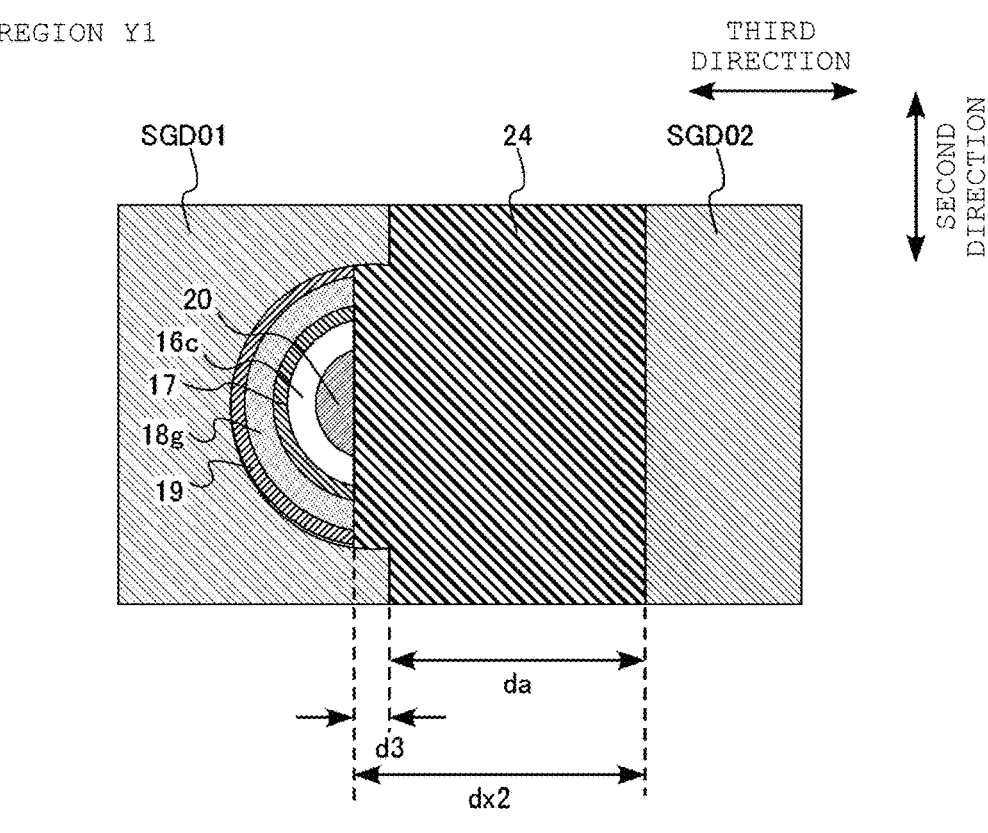
FIGS. 9A and 9B are enlarged schematic diagrams of part of the memory cell array of the semiconductor memory device according to the embodiment.
Figure 9B:
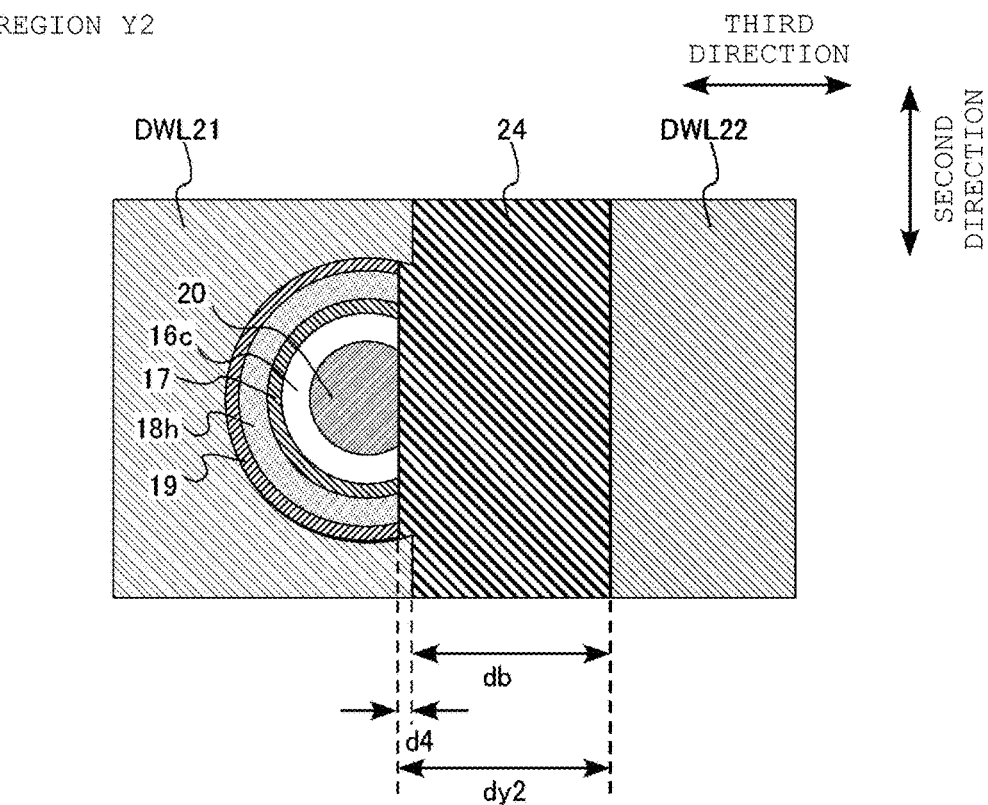

FIGS. 9A and 9B are enlarged schematic diagrams of part of a memory cell array of a semiconductor memory device according to the embodiment. FIGS. 9A and 9B are cross-sectional views of the memory cell array 100 perpendicular to the first direction. FIG. 9A is an enlarged view of a part of FIG. 6. FIG. 9A is a diagram corresponding to the region Y1 in FIG. 6. FIG. 9B is an enlarged view of a part of FIG. 7. FIG. 9B is a diagram corresponding to the region Y2 in FIG. 7.

As shown in FIG. 9A, the distance in the third direction (dx2 in FIG. 9A) between the second drain select gate line SGD02 and the seventh charge storage layer 18g is greater than the distance in the third direction (da in FIG. 9A) between the first drain select gate line SGD01 and the second drain select gate line SGD02. In other words, the seventh charge storage layer 18g is recessed inward from the end of the first drain select gate line SGD01.

A distance dx2 in the third direction between the second drain select gate line SGD02 and the third semiconductor layer 16c is greater than a distance da in the third direction between the first drain select gate line SGD01 and the second drain select gate line SGD02. That is, the third semiconductor layer 16c is recessed inward from the end of the first drain select gate line SGD01.

As shown in FIG. 9B, the distance in the third direction (dy2 in FIG. 9B) between the fourth region DWL22 and the eighth charge storage layer 18h is equal to or greater than the distance in the third direction (db in FIG. 9B) between the third region DWL21 and the fourth region DWL22. That is, the eighth charge storage layer 18h is either flush with the end of the third region DWL21 or recessed inward from the end.

A distance dy2 in the third direction between the fourth region DWL22 and the third semiconductor layer 16c is equal to or greater than a distance db in the third direction between the third region DWL21 and the fourth region DWL22. That is, the first semiconductor layer 16a is either flush with the end of the fourth region DWL22 or recessed inward from the end.

Further, the third distance (d3 in FIG. 9A) in the third direction from the end of the first drain select gate line SGD01 on the second drain select gate line SGD02 side to the end of the seventh charge storage layer 18g on the second drain select gate line SGD02 side is greater than the fourth distance (d4 in FIG. 9B) in the third direction from the end of third region DWL21 on the fourth region DWL22 side to the end of the eighth charge storage layer 18h on the fourth region DWL22 side.

The third distance d3 is, for example, 10 nm or more and 20 nm or less. The fourth distance d4 is, for example, 0 nm or more and 5 nm or less.

The third distance d3 is, for example, two to ten times the fourth distance d4.

Further, the distance in the third direction (d3 in FIG. 9A) from the end of the first drain select gate line SGD01 on the second drain select gate line SGD02 side to the end of the third semiconductor layer 16c on the second drain select gate line SGD02 side is greater than the distance in the third direction (d4 in FIG. 9B) from the end of the third region DWL21 on the fourth region DWL22 side to the end of the third semiconductor layer 16c on the fourth region DWL22 side.

Next, an example of a manufacturing method of the semiconductor memory device according to the embodiment will be described. FIGS. 10, 11, 12, 13, 14, and 15 are schematic diagrams showing the manufacturing method of the semiconductor memory device according to the embodiment. FIGS. 10, 11, 12, 13, 14, and 15 are cross-sectional views showing cross sections corresponding to FIG. 2.

Figure 10:
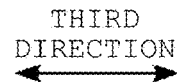
FIG. 10 is a schematic diagram showing a manufacturing method of the semiconductor memory device according to the embodiment.

First, a substrate insulating layer 12 and a common source line CSL are formed on a semiconductor substrate 10 using a known manufacturing method. Next, using a known manufacturing method, the stacked body 22, and the semiconductor layer 16, the tunnel insulating layer 17, the charge storage layer 18, the block insulating layer 19, and the core insulating layer 20, penetrating the stacked body 22, are formed (FIG. 10).

The stacked body 22 includes a source select gate line SGS, a plurality of word lines WL, a plurality of dummy word lines DWL, a plurality of drain select gate line layers SGDL, and a plurality of interlayer insulating layers 14. The stacked body 22, the semiconductor layer 16, the tunnel insulating layer 17, the charge storage layer 18, the block insulating layer 19, and the core insulating layer 20, penetrating the stacked body 22, are formed, for example, by embedding the memory holes MH provided in the stacked body 22.

Figure 11:
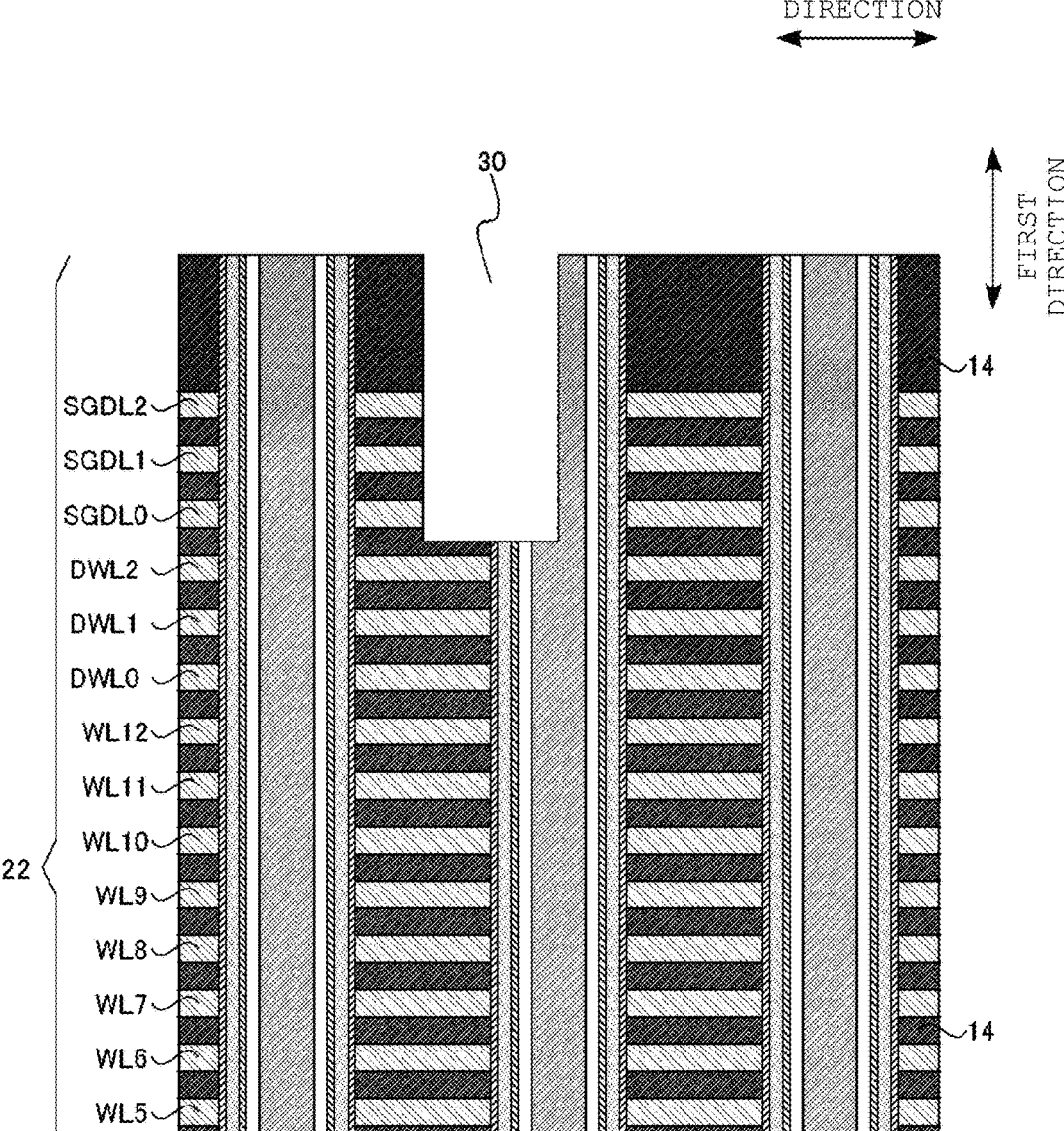
FIG. 11 is a schematic diagram showing the manufacturing method of the semiconductor memory device according to the embodiment.

A first isolation trench 30 is then formed in a portion of the stacked body 22 (FIG. 11). The first isolation trench 30 is formed by, for example, lithographic method and reactive ion etching method (RIE method).

The bottom surface of the first isolation trench 30 reaches the drain select gate line layer SGDL0. Further, the bottom surface of the first isolation trench 30 does not reach the dummy word line DWL2. The first isolation trench 30 extends in the second direction.

Next, the charge storage layer 18 exposed on the side surface of the first isolation trench 30 is etched and recessed by performing isotropic etching. In this case, for example, the semiconductor layer 16, the tunnel insulating layer 17, the block insulating layer 19, and the core insulating layer 20 are also recessed at the same time. Isotropic etching is, for example, wet etching. The etching amount by isotropic etching is, for example, 10 nm or more and 20 nm or less.

Figure 12:
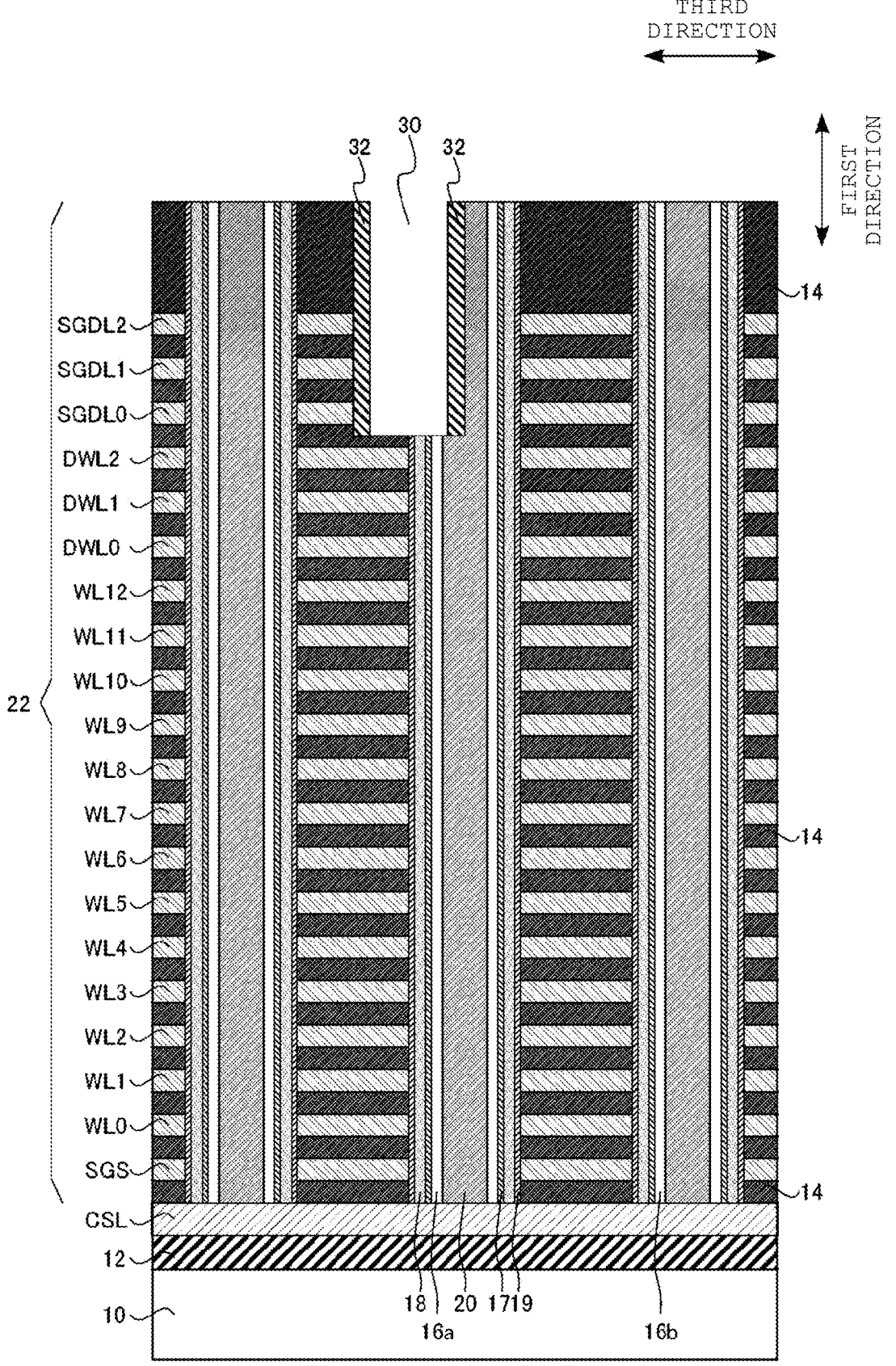
FIG. 12 is a schematic diagram showing the manufacturing method of the semiconductor memory device according to the embodiment.

Next, a side wall insulating film 32 is formed on the side surface of the first isolation trench 30 (FIG. 12). The side wall insulating film 32 is formed by, for example, chemical vapor deposition (CVD) method and an RIE method. The side wall insulating film 32 finally becomes part of the isolation insulating layer 24. The side wall insulating film 32 is, for example, silicon oxide.

Figure 13:
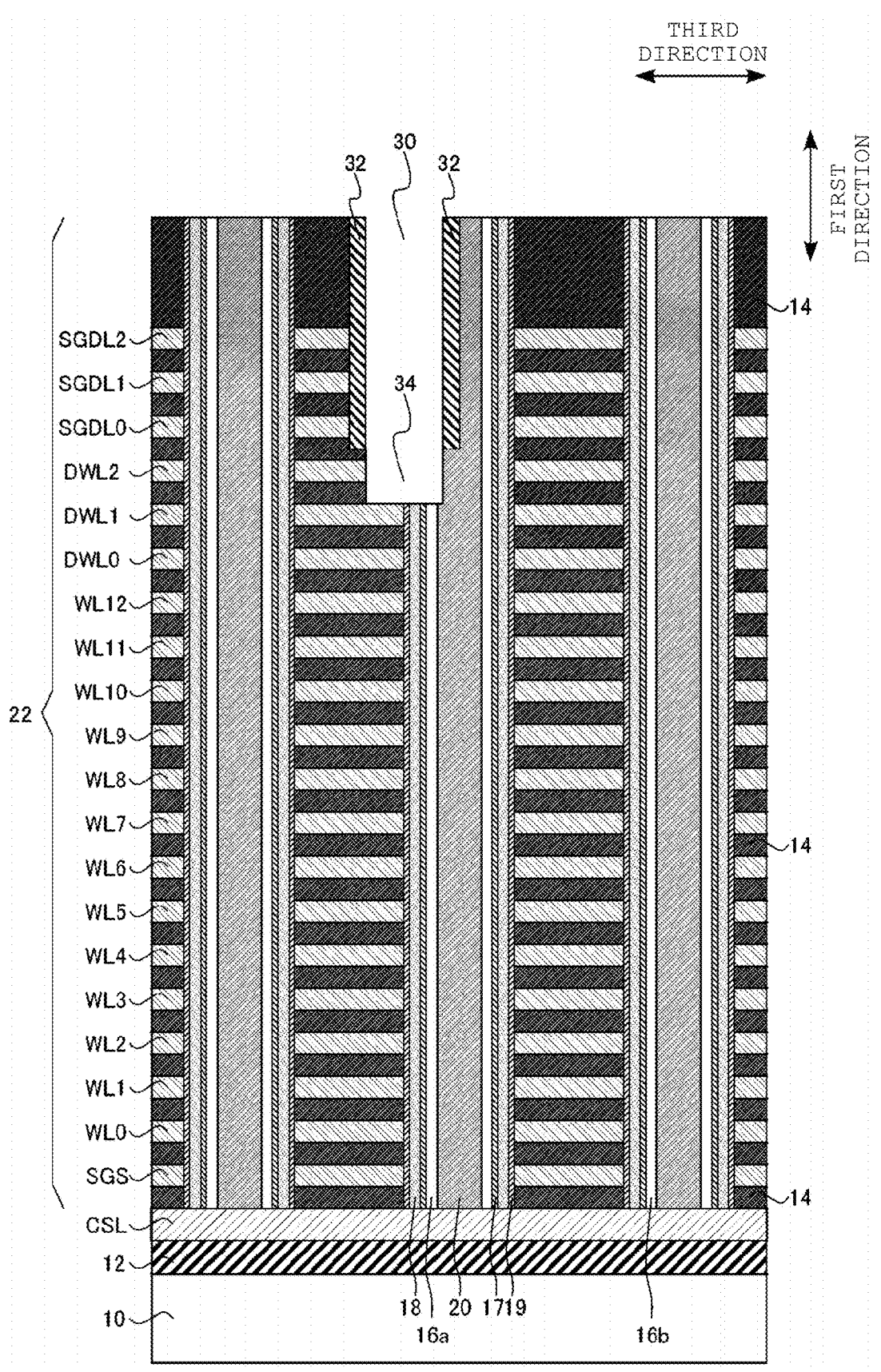
FIG. 13 is a schematic diagram showing the manufacturing method of the semiconductor memory device according to the embodiment.

Next, using the side wall insulating film 32 as a mask material, a second isolation trench 34 is formed (FIG. 13). The second isolation trench 34 is formed by, for example, the RIE method.

The bottom surface of the second isolation trench 34 reaches the dummy word line DWL2. The second isolation trench 34 separates the dummy word line DWL2. The second isolation trench 34 extends in the second direction.

Figure 14:
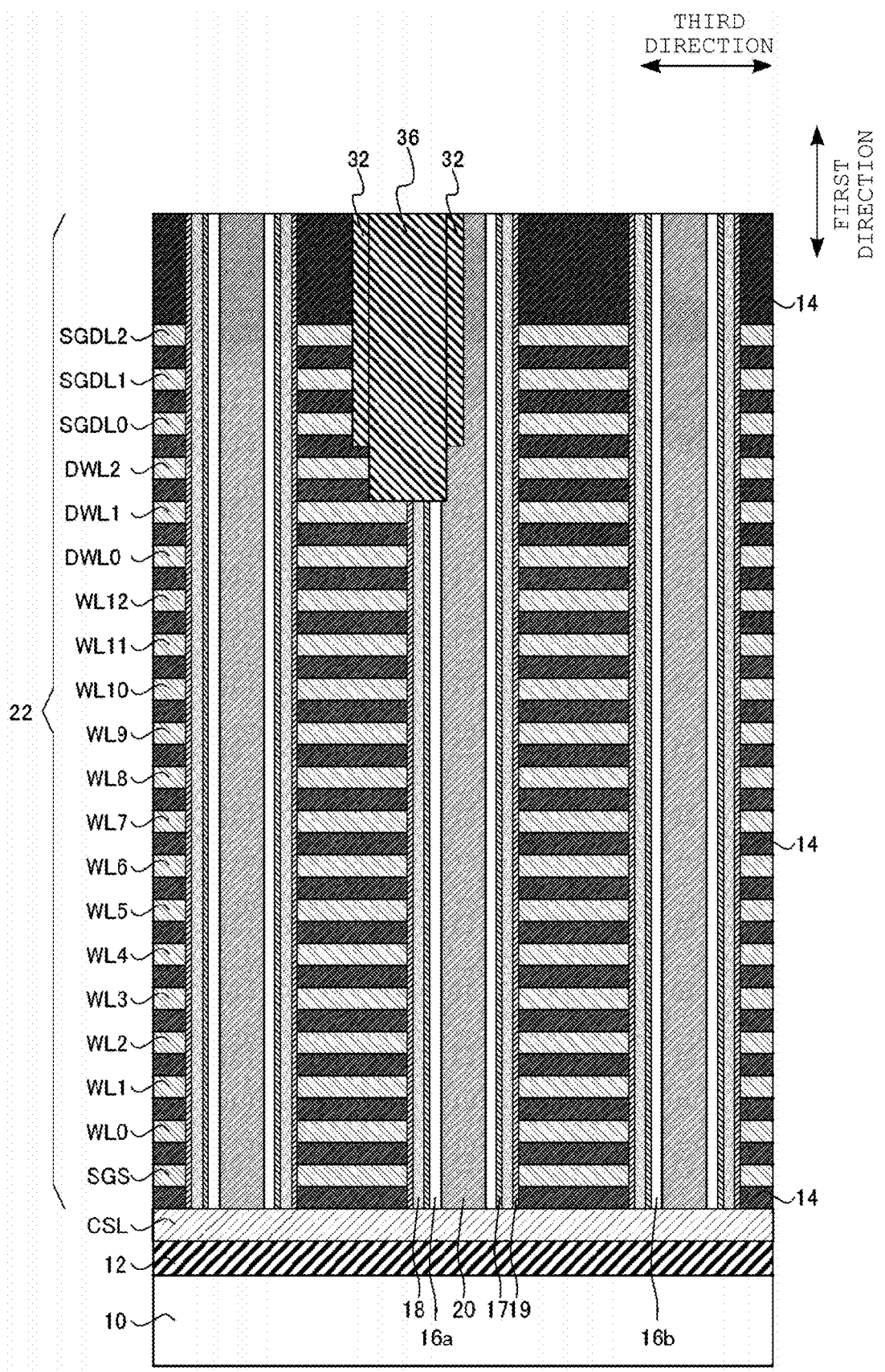
FIG. 14 is a schematic diagram showing the manufacturing method of the semiconductor memory device according to the embodiment.

Next, the second isolation trench 34 and the first isolation trench 30 are filled with an embedded insulating film 36 (FIG. 14). The embedded insulating film 36 is formed by, for example, the CVD method. The embedded insulating film 36 finally becomes part of the isolation insulating layer 24. The embedded insulating film 36 is, for example, silicon oxide.

Figure 15:
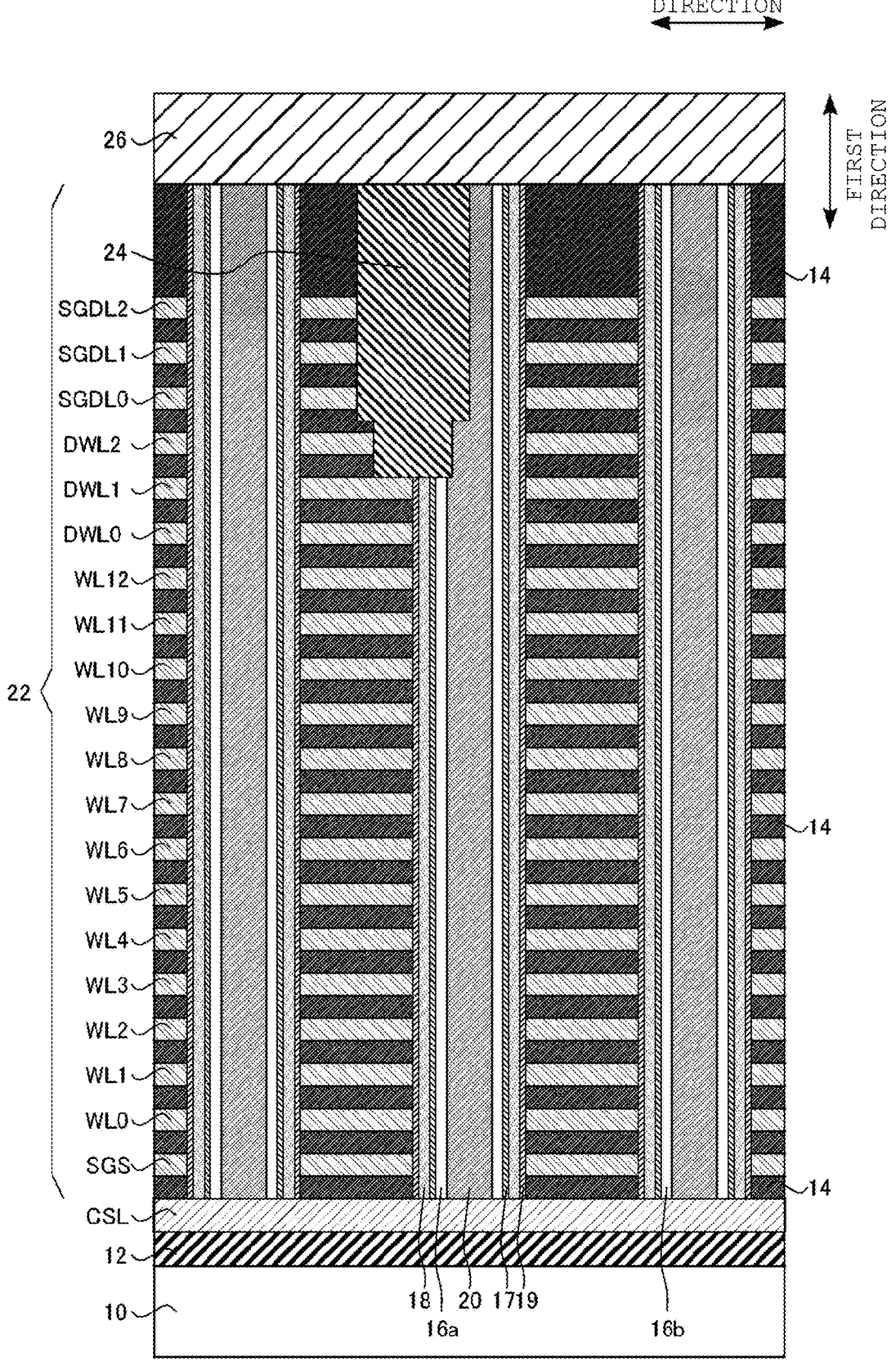
FIG. 15 is a schematic diagram showing the manufacturing method of the semiconductor memory device according to the embodiment.

Next, the upper insulating layer 26 is formed on the stacked body 22 and the isolation insulating layer 24 (FIG. 15). The upper insulating layer 26 is formed by, for example, the CVD method. The upper insulating layer 26 is, for example, silicon oxide.

Thereafter, the contact plug 21 and the bit line BL are formed using a known process technology.

By the manufacturing method described above, the memory cell array 100 of the semiconductor memory device of the embodiment is manufactured.

Next, the action and effect of the semiconductor memory device of the embodiment will be described.

A three-dimensional NAND flash memory in which memory cells are located three-dimensionally achieves high integration and low cost. When manufacturing the three-dimensional NAND flash memory, for example, a memory string in which a plurality of memory cells are connected in series is formed by forming memory holes penetrating the stacked body, in the stacked body in which a plurality of insulating layers and a plurality of gate electrode layers are stacked, and forming a charge storage layer and a semiconductor layer in each of the memory hole. For example, by increasing the number of memory holes per unit area, the capacity of the three-dimensional NAND flash memory can be increased.

Figure 16:
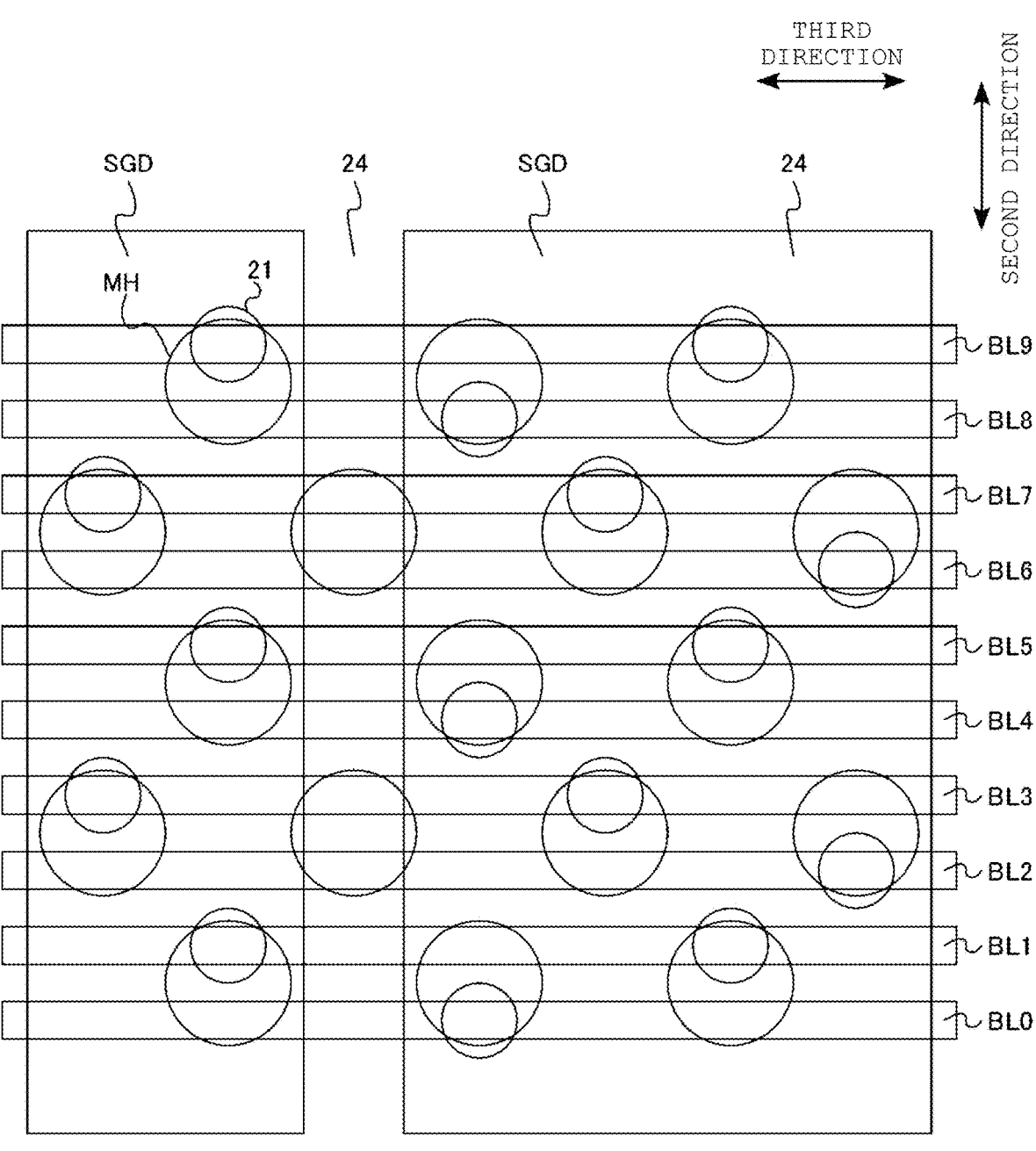
FIG. 16 is a schematic diagram of part of a memory cell array of a semiconductor memory device of a first comparative example.

FIG. 16 is a schematic diagram of part of the memory cell array of the semiconductor memory device of a first comparative example. FIG. 16 is a top view corresponding to FIG. 3 of the embodiment. FIG. 16 is a diagram showing a layout pattern of a memory cell array. FIG. 16 shows patterns of memory holes MH and contact plugs 21.

The memory cell array of the three-dimensional NAND flash memory of the first comparative example differs from the memory cell array of the three-dimensional NAND flash memory of the embodiment in that the contact plugs 21 and the bit lines BL are not connected to the semiconductor layers in the memory holes MH divided by the isolation insulating layer 24.

In the three-dimensional NAND flash memory of the first comparative example, the memory strings MS corresponding to the memory holes MH divided by the isolation insulating layer 24 may not be used as storage capacity.

On the other hand, in the three-dimensional NAND flash memory of the embodiment, as shown in FIG. 3, the memory strings MS corresponding to the memory holes MH divided by the isolation insulating layer 24 can also be used as storage capacity. Therefore, compared to the three-dimensional NAND flash memory of the first comparative example, the width of the memory cell array in the third direction can be reduced. Therefore, the capacity of the three-dimensional NAND flash memory can be increased.

Figure 17:
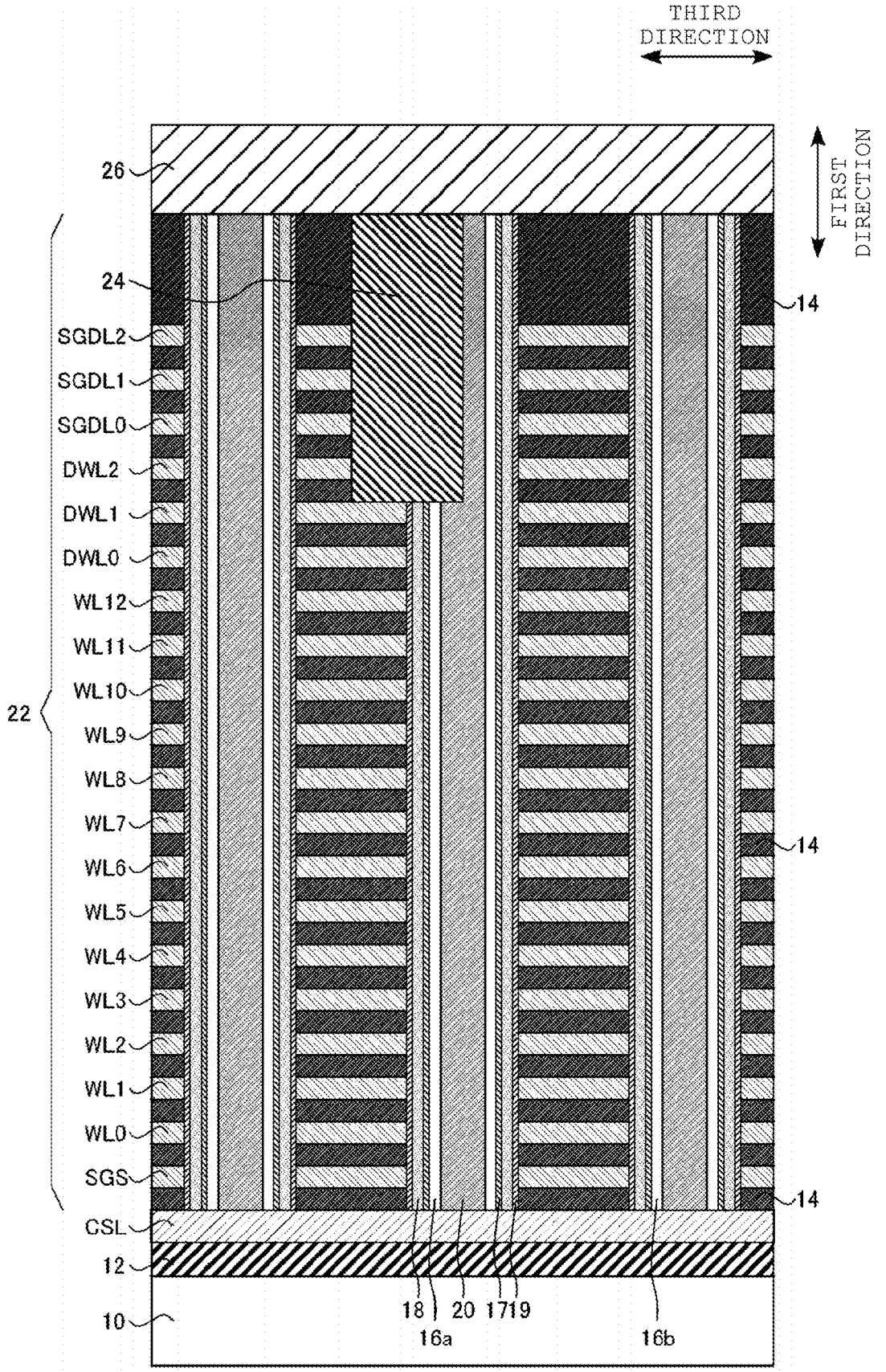
FIG. 17 is a schematic diagram of part of a memory cell array of a semiconductor memory device of a second comparative example.

FIG. 17 is a schematic diagram of part of the memory cell array of the semiconductor memory device of a second comparative example. FIG. 17 is a diagram corresponding to FIG. 2 of the embodiment.

The three-dimensional NAND flash memory of the second comparative example differs from the three-dimensional NAND flash memory of the embodiment in that the side surface of the isolation insulating layer 24 does not have a stepped portion S in planes parallel to the first direction and the third direction.

Figure 18A:
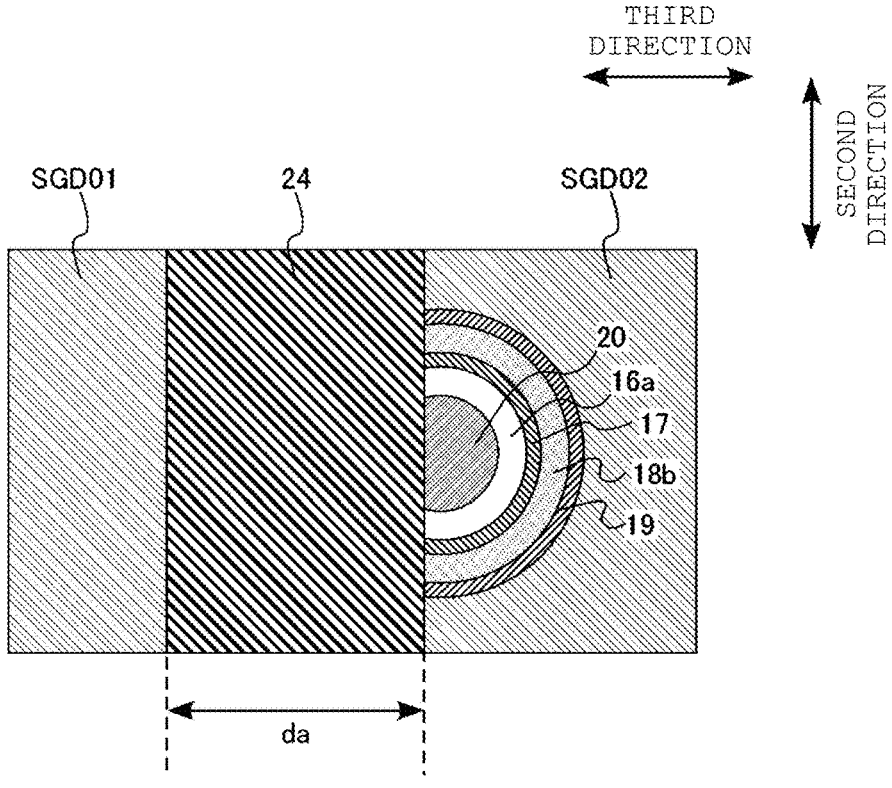
FIGS. 18A and 18B are enlarged schematic diagrams of part of a memory cell array of a semiconductor memory device of the second comparative example.
Figure 18B:
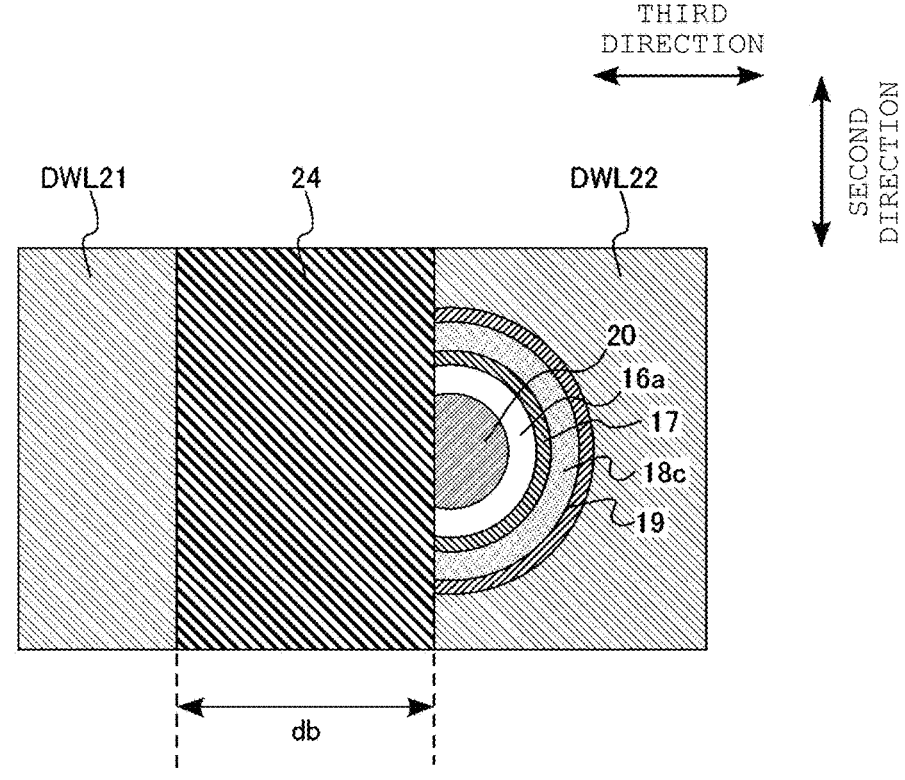

FIGS. 18A and 18B are enlarged schematic diagrams of part of a memory cell array of a semiconductor memory device according to the second comparative example. FIGS. 18A and 18B are cross-sectional views of the memory cell array of the second comparative example perpendicular to the first direction. FIG. 18A is a diagram corresponding to FIG. 8A of the embodiment. Further, FIG. 18B is a diagram corresponding to FIG. 8B of the embodiment.

The three-dimensional NAND flash memory of the second comparative example differs from the three-dimensional NAND flash memory of the embodiment in that the second charge storage layer 18b is not recessed inward from the end of the second drain select gate line SGD02. Further, this differs from the three-dimensional NAND flash memory of the embodiment in that the distance in the third direction (da in FIG. 18A) between the first drain select gate line SGD01 and the second drain select gate line SGD02 is equal to the distance in the third direction (db in FIG. 18B) between the third region DWL21 and the fourth region DWL22.

Figure 19A:
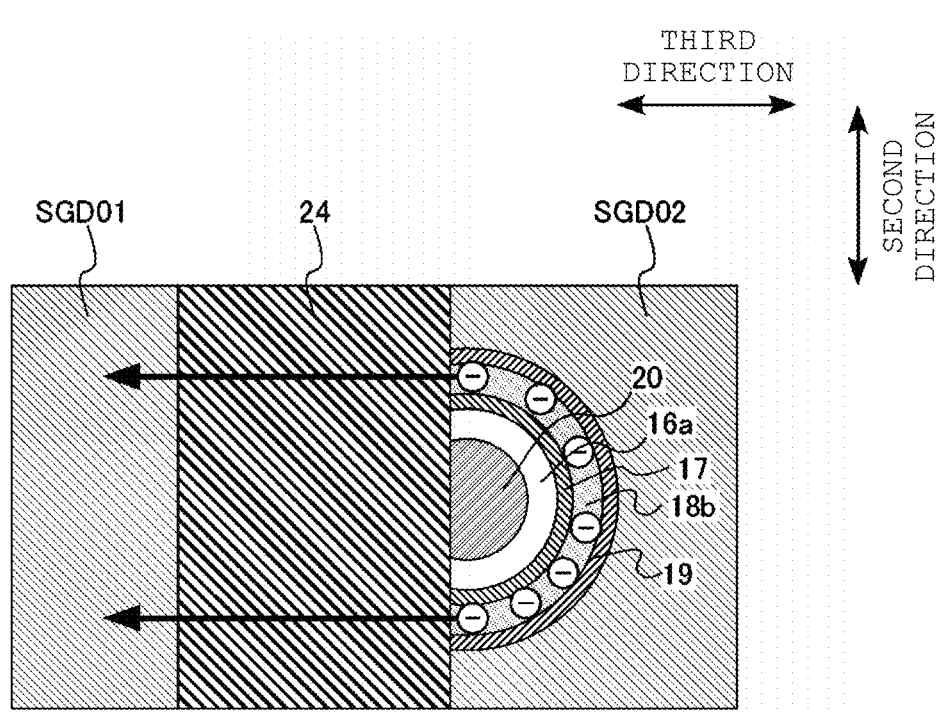
FIGS. 19A and 19B are explanatory diagrams of a problem that the semiconductor memory device of the second comparative example has.
Figure 19B:
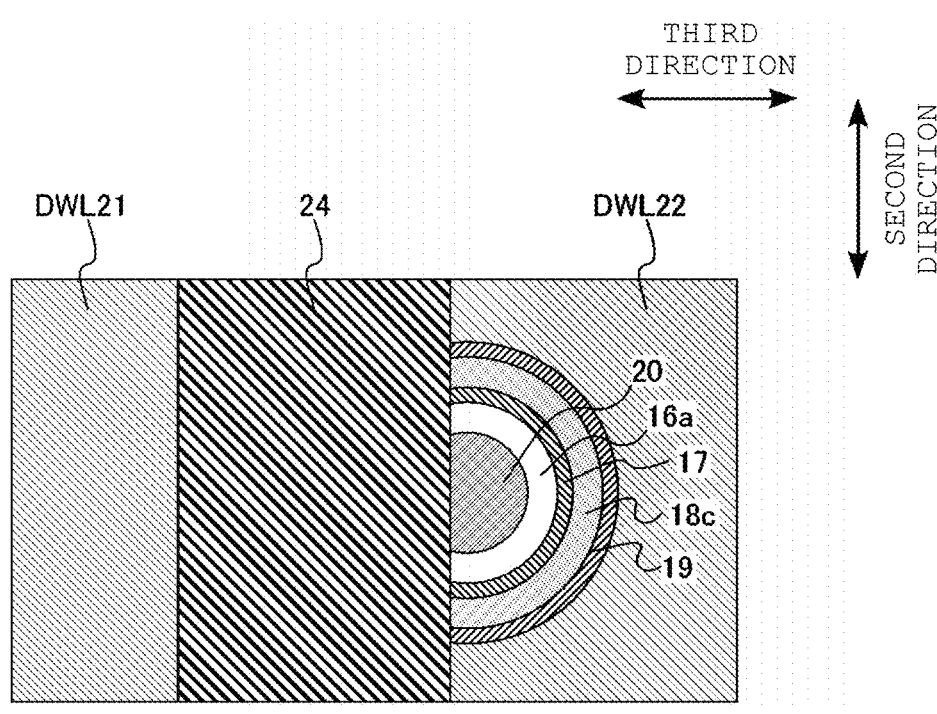

FIGS. 19A and 19B are explanatory diagrams of a problem that the semiconductor memory device of the second comparative example has.

For example, the threshold voltage of the drain select transistor SDT controlled by the second drain select gate line SGD02 is adjusted by the charge amount stored in the second charge storage layer 18b. Therefore, when the amount of charges stored in the second charge storage layer 18b fluctuates, the threshold voltage of the drain select transistor SDT fluctuates, which poses a problem.

For example, a case is considered where the first drain select gate line SGD01 is selected and the second drain select gate line SGD02 is unselected during the read operation of the three-dimensional NAND flash memory of the second comparative example. In this case, the first drain select gate line SGD01 becomes a positive voltage with respect to the second drain select gate line SGD02. Therefore, as shown in FIG. 19A, electrons stored in the second charge storage layer 18b may move to the first drain select gate line SGD01. In particular, since the second charge storage layer 18b has a horseshoe shape, electrons are likely to escape from the end of the second charge storage layer 18b on the first drain select gate line SGD01 side.

When electrons stored in the second charge storage layer 18b move, the threshold voltage of the drain select transistor SDT controlled by the second drain select gate line SGD02 fluctuates. Therefore, the reliability of the three-dimensional NAND flash memory of the second comparative example is lowered.

In the three-dimensional NAND flash memory of the embodiment, as shown in FIG. 8A, the distance in the third direction (dx1 in FIG. 8A) between the first drain select gate line SGD01 and the second charge storage layer 18b is greater than the distance in the third direction (da in FIG. 8A) between the first drain select gate line SGD01 and the second drain select gate line SGD02. That is, the second charge storage layer 18b is recessed inward from the end of the second drain select gate line SGD02.

The three-dimensional NAND flash memory of the embodiment can increase the distance dx1 in the third direction between the first drain select gate line SGD01 and the second charge storage layer 18b, compared to the three-dimensional NAND flash memory of the second comparative example. Therefore, during the read operation of the three-dimensional NAND flash memory of the embodiment, electrons stored in the second charge storage layer 18b are prevented from moving to the first drain select gate line SGD01. Therefore, the reliability of the three-dimensional NAND flash memory of the embodiment is improved.

In the three-dimensional NAND flash memory of the embodiment, the first distance (d1 in FIG. 8A) in the third direction from the end of the second drain select gate line SGD02 on the first drain select gate line SGD01 side to the end of the second charge storage layer 18b on the first drain select gate line SGD01 side is preferably 10 nm or more and 20 nm or less. By setting the first distance d1 to 10 nm or more, the movement of electrons stored in the second charge storage layer 18b can be further prevented. Further, by setting the first distance d1 to 20 nm or less, the volume of the second charge storage layer 18b is maintained at a certain value or more, and the threshold voltage of the drain select transistor SDT can be easily adjusted.

In the three-dimensional NAND flash memory of the embodiment, from the viewpoint of further preventing movement of electrons stored in the second charge storage layer 18b, the first semiconductor layer 16a is preferably recessed inward from the end of the second drain select gate line SGD02.

When manufacturing the three-dimensional NAND flash memory of the embodiment, the charge storage layer 18 exposed on the side surface of the first isolation trench 30 is etched. By this process, a structure in which the second charge storage layer 18b and the first semiconductor layer 16a are recessed inward from the end of the second drain select gate line SGD02 can be formed.

Figure 20A:
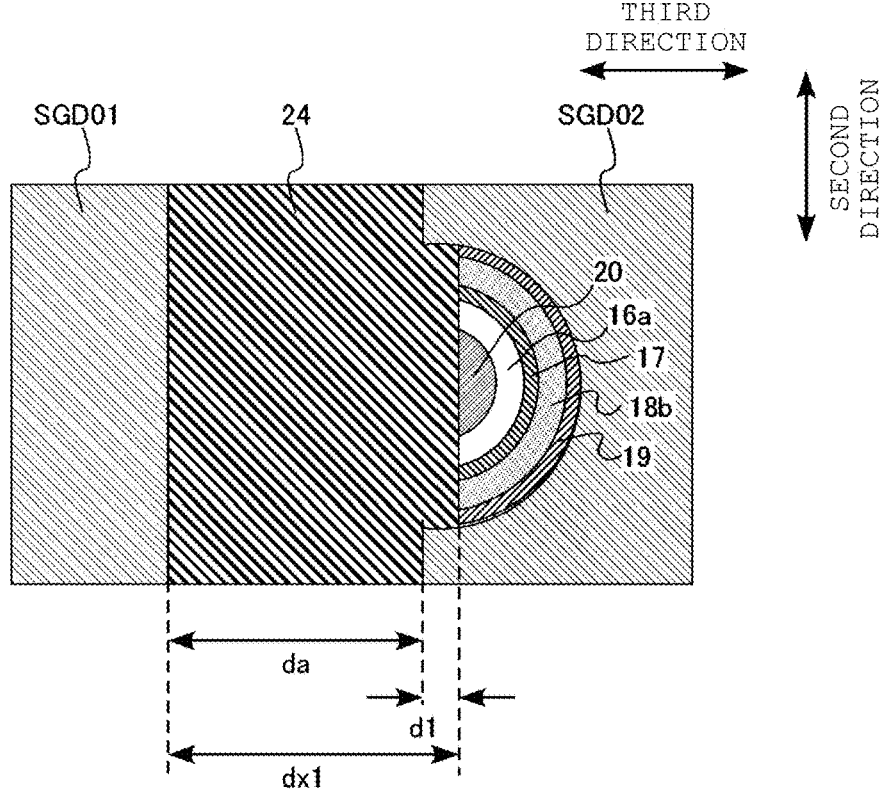
FIGS. 20A and 20B are enlarged schematic diagrams of part of a memory cell array of a semiconductor memory device of a third comparative example.
Figure 20B:
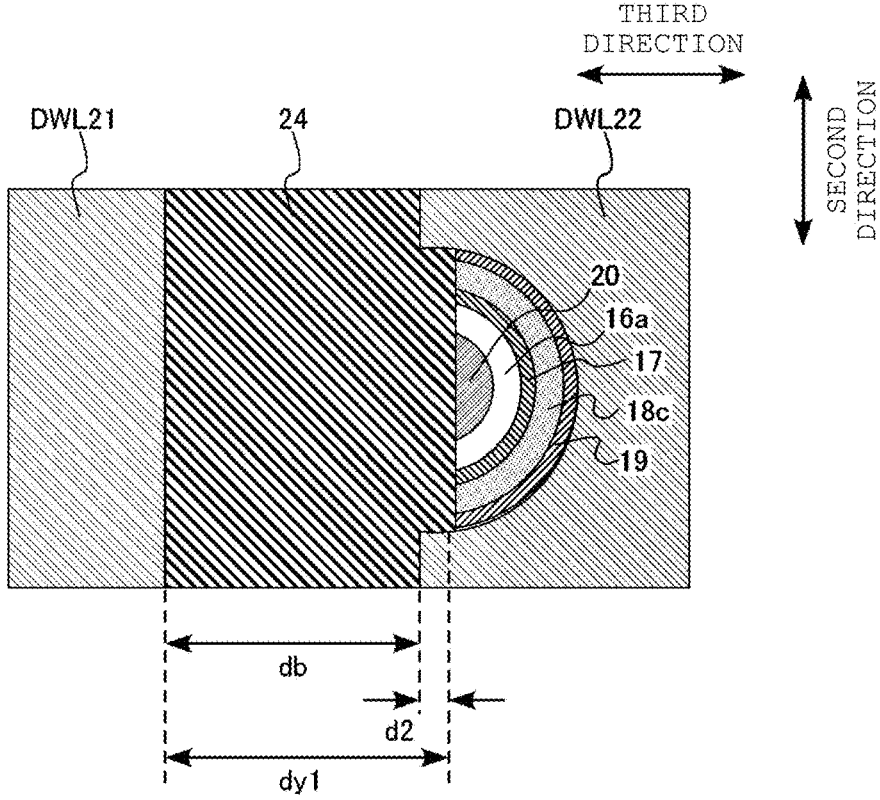

FIGS. 20A and 20B are enlarged schematic diagrams of part of a memory cell array of a semiconductor memory device according to a third comparative example. FIGS. 20A and 20B are cross-sectional views of the memory cell array of the third comparative example perpendicular to the first direction. FIG. 20A is a diagram corresponding to FIG. 8A of the embodiment. Further, FIG. 20B is a diagram corresponding to FIG. 8B of the embodiment.

In the three-dimensional NAND flash memory of the third comparative example, as shown in FIG. 20B, the third charge storage layer 18c is recessed inward from the end of the fourth region DWL22. This differs from the three-dimensional NAND flash memory of the embodiment in that the first distance in the third direction (d1 in FIG. 20A) from the end of the second drain select gate line SGD02 on the first drain select gate line SGD01 side to the end of the second charge storage layer 18b on the first drain select gate line SGD01 side is equal to the second distance in the third direction (d2 in FIG. 20B) from the end of the fourth region DWL22 on the third region DWL21 side to the end of the third charge storage layer 18c on the third region DWL21 side.

Further, this differs from the three-dimensional NAND flash memory of the embodiment in that the distance in the third direction (da in FIG. 20A) between the first drain select gate line SGD01 and the second drain select gate line SGD02 is equal to the distance in the third direction (db in FIG. 20B) between the third region DWL21 and the fourth region DWL22.

Figures 21A, 21B:
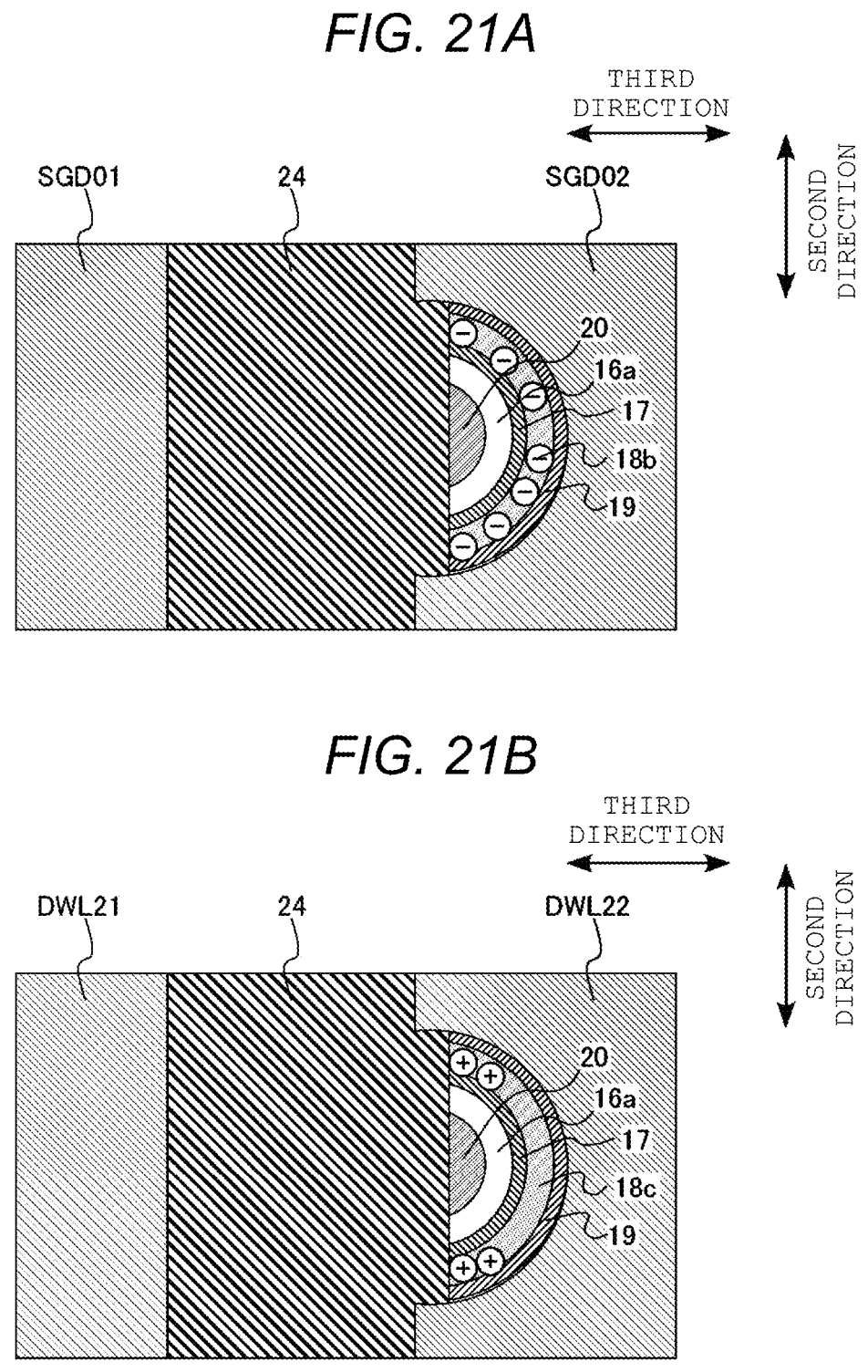

FIGS. 21A and 21B are explanatory diagrams of a problem that the semiconductor memory device of the third comparative example has.

As described above, the threshold voltage of the drain select transistor SDT controlled by the second drain select gate line SGD02 is adjusted by the charge amount stored in the second charge storage layer 18b. Therefore, when the amount of charges stored in the second charge storage layer 18b fluctuates, the threshold voltage of the drain select transistor SDT fluctuates, which poses a problem.

For example, during the erasing operation of the three-dimensional NAND flash memory of the third comparative example, when the third charge storage layer 18c is recessed inward from the end of the fourth region DWL22, holes are excessively generated in the third charge storage layer 18c, as shown in FIG. 21B. It is considered that this is caused by the concentration of the electric field at the end of the third charge storage layer 18c having a horseshoe shape during the erasing operation.

When holes are excessively generated in the third charge storage layer 18c, electrons stored in the second charge storage layer 18b immediately above the third charge storage layer 18c move toward the third charge storage layer 18c. When electrons stored in the second charge storage layer 18b move, the threshold voltage of the drain select transistor SDT controlled by the second drain select gate line SGD02 fluctuates. Therefore, the reliability of the three-dimensional NAND flash memory of the third comparative example is lowered.

In the three-dimensional NAND flash memory of the embodiment, the first distance in the third direction (d1 in FIG. 8A) from the end of the second drain select gate line SGD02 on the first drain select gate line SGD01 side to the end of the second charge storage layer 18b on the first drain select gate line SGD01 side is greater than the second distance in the third direction (d2 in FIG. 8B) from the end of the fourth region DWL22 on the third region DWL21 side to the end of the third charge storage layer 18c on the third region DWL21 side.

Making the second distance d2 smaller than the first distance d1 prevents excessive generation of holes in the third charge storage layer 18c, during the erasing operation of the three-dimensional NAND flash memory of the embodiment. Therefore, electrons stored in the second charge storage layer 18b immediately above the third charge storage layer 18c are prevented from moving toward the third charge storage layer 18c, and fluctuation of the threshold voltage of the drain select transistor SDT is prevented. Therefore, the reliability of the three-dimensional NAND flash memory of the embodiment is improved.

The second distance d2 is preferably 5 nm or less. By setting the second distance d2 to 5 nm or less, movement of electrons stored in the second charge storage layer 18b is further prevented.

Further, the first distance d1 is preferably two to ten times the second distance d2. By satisfying the above range, movement of electrons stored in the second charge storage layer 18b is effectively prevented, and fluctuation of the threshold voltage of the select gate transistor is further prevented.

In the three-dimensional NAND flash memory of the embodiment, from the viewpoint of preventing excessive generation of holes in the third charge storage layer 18c during an erasing operation, the first semiconductor layer 16a is preferably recessed inward from the end of the fourth region DWL22.

When manufacturing the three-dimensional NAND flash memory of the embodiment, the charge storage layer 18 exposed on the side surface of the first isolation trench 30 is etched. By this process, a structure in which the second charge storage layer 18b and the first semiconductor layer 16a are recessed inward from the end of the second drain select gate line SGD02 can be formed.

Then, after forming the side wall insulating film 32 on the side surface of the first isolation trench 30, the side wall insulating film 32 is used as a mask material to form the second isolation trench 34. The second isolation trench 34 separates the dummy word line DWL2. This process prevents the third charge storage layer 18c and the first semiconductor layer 16a from being recessed inward from the end of the fourth region DWL22.

Since the width of the second isolation trench 34 in the third direction is narrower than the width of the first isolation trench 30, a stepped portion S is formed on the side surface of the isolation insulating layer 24, as shown in FIG. 2.

As described above, according to the embodiment, a three-dimensional NAND flash memory with improved reliability can be achieved.

Figure 22:
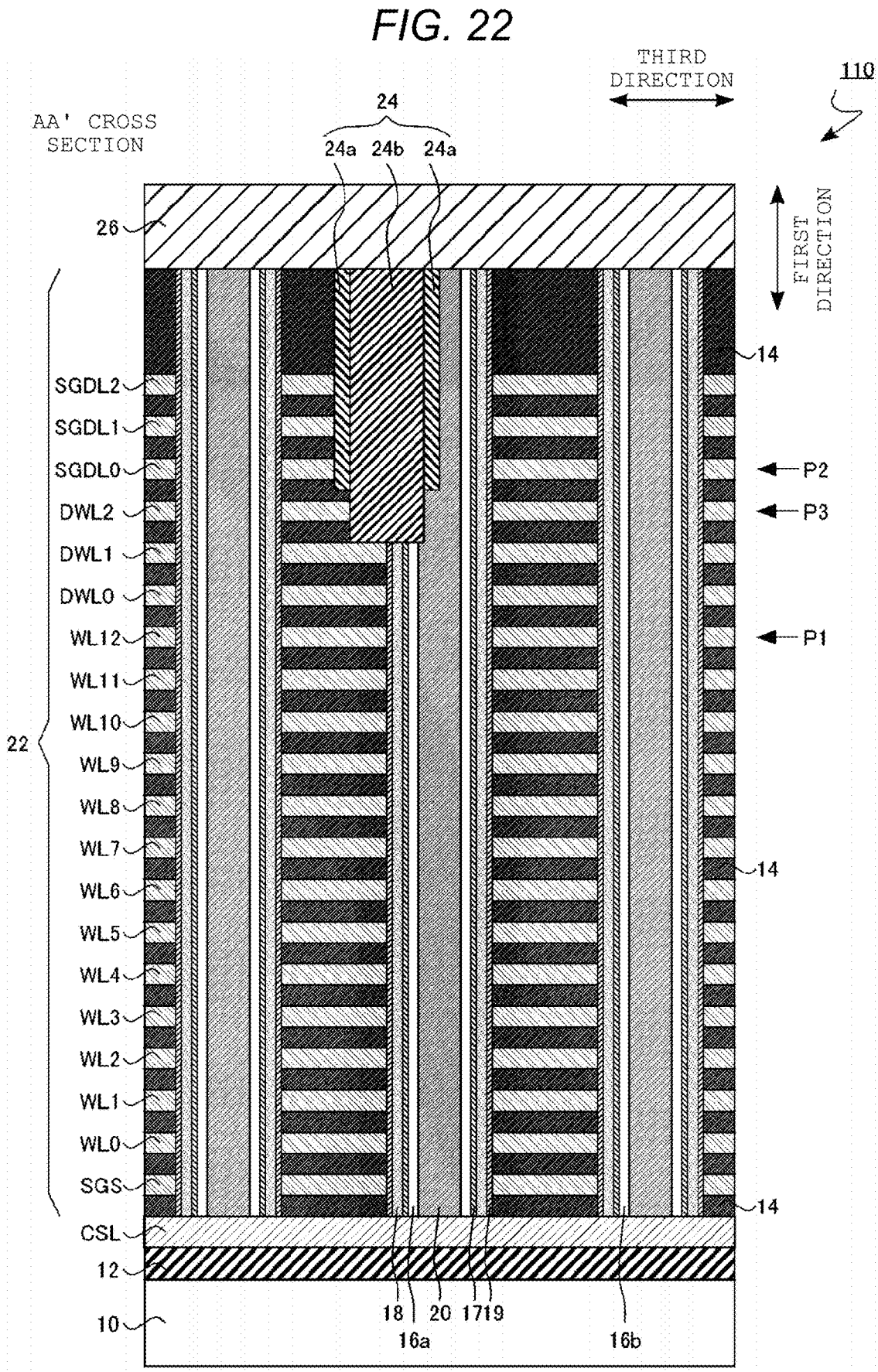
FIG. 22 is a schematic diagram of part of a memory cell array of a semiconductor memory device according to a first modification of the embodiment.

FIG. 22 is a schematic diagram of part of a memory cell array of a semiconductor memory device according to a first modification of the embodiment. FIG. 22 is a diagram corresponding to FIG. 2 of the embodiment.

The three-dimensional NAND flash memory of the first modification differs from the three-dimensional NAND flash memory of the embodiment in that a first material of a first portion of the first insulating layer in contact with the second gate electrode layer is different from a second material of a second portion of the first insulating layer in contact with the third gate electrode layer.

As shown in FIG. 22, in the memory cell array 110 of the three-dimensional NAND flash memory of the first modification, the isolation insulating layer 24 includes a first portion 24a and a second portion 24b. The first portion 24a is in contact with the drain select gate line layer SGDL0. Further, the second portion 24b is in contact with the dummy word line DWL2.

The first material of the first portion 24a and the second material of the second portion 24b are different. For example, the first portion 24a is silicon oxide and the second portion 24b is silicon nitride. Further, for example, the first portion 24a is silicon nitride and the second portion 24b is silicon oxide.

Optimal materials are selected for the first material and the second material, respectively, from the viewpoint of manufacturing such as embedding characteristics and etching characteristics. Further, optimal materials are selected for the first material and the second material, respectively, from the viewpoint of memory operation characteristics of the three-dimensional NAND flash memory.

For example, when manufacturing the three-dimensional NAND flash memory of the first modification, by changing the material of the side wall insulating film 32 and the material of the embedded insulating film 36, the first material of the first portion 24*a* and the second material of the second portion 24*b* can be changed.

As described above, according to the first modification of the embodiment, a three-dimensional NAND flash memory with improved reliability can be achieved.

Figure 23A:
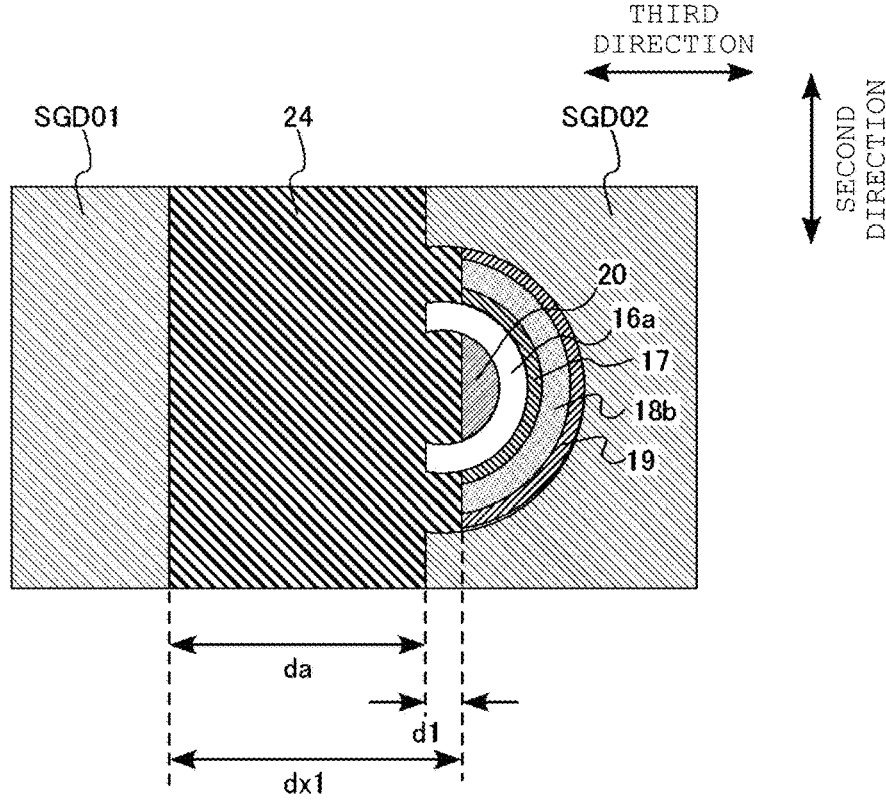
FIGS. 23A and 23B are enlarged schematic diagrams of part of a memory cell array of a semiconductor memory device according to a second modification of the embodiment.
Figure 23B:
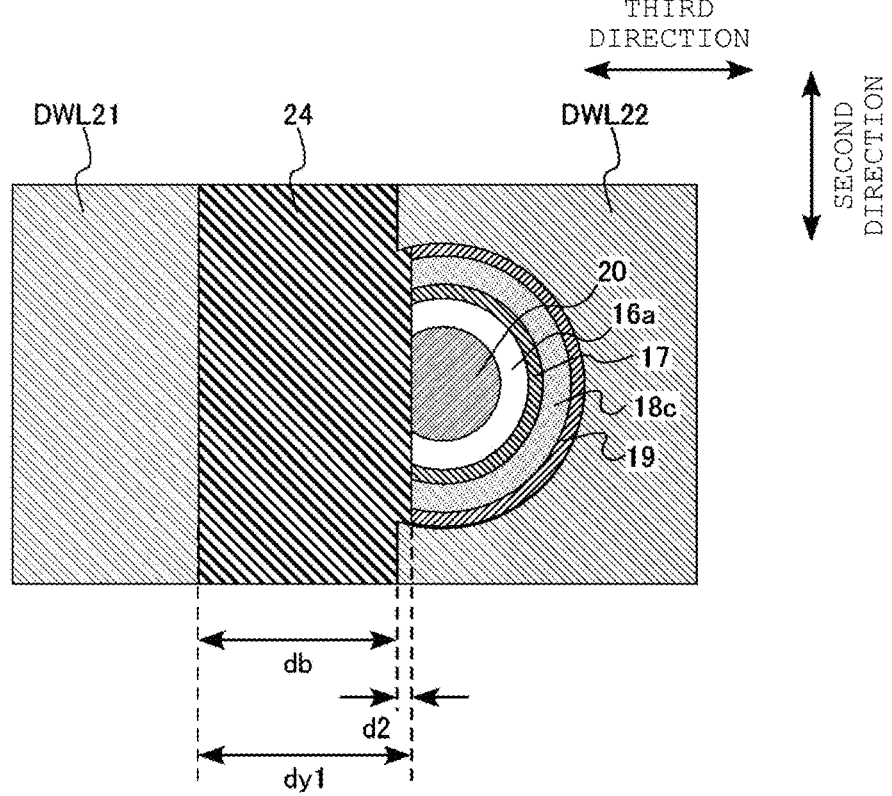

FIGS. 23A and 23B are enlarged schematic diagrams of part of a memory cell array of a semiconductor memory device according to a second modification of the embodiment. FIG. 23A is a cross-sectional view of the memory cell array of the second modification perpendicular to the first direction. FIG. 23A is a diagram corresponding to FIG. 8A of the embodiment. Further, FIG. 23B is a diagram corresponding to FIG. 8B of the embodiment.

The three-dimensional NAND flash memory of the second modification differs from the three-dimensional NAND flash memory of the embodiment in that the first semiconductor layer 16*a* is not recessed inward from the end of the second drain select gate line SGD02, as shown in FIG. 23B.

For example, in the manufacture of the three-dimensional NAND flash memory of the second modification, when the charge storage layer 18 exposed on the side surface of the first isolation trench 30 is etched to be recessed, etching conditions are adopted that have a selectivity with respect to the semiconductor layer 16. This process prevents the first semiconductor layer 16*a* from being recessed inward from the end of the second drain select gate line SGD02.

As described above, according to the second modification of the embodiment, a three-dimensional NAND flash memory with improved reliability can be achieved.

As described above, according to the embodiment and its modifications, three-dimensional NAND flash memories with improved reliability can be achieved.

In the embodiment and its modification, the case where the word lines WL have 12 layers, the dummy word lines DWL have 3 layers, and the drain select gate line layers SGDL have 3 layers has been described as an example, but the number of layers is not limited to the above.

Further, in the embodiment, the insulating layer between the word lines WL may be hollow, for example.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device comprising:
a stacked body having a plurality of first insulating layers and a plurality of gate electrode layers alternately stacked in a first direction;
a first semiconductor layer disposed in the stacked body and extending in the first direction;
a first gate electrode layer being one of the plurality of gate electrode layers;
a second gate electrode layer being another one of the plurality of gate electrode layers, the second gate electrode layer including a first region extending in a second direction orthogonal to the first direction, and a second region separated from the first region and extending in the second direction, the first semiconductor layer being disposed between the first region and the second region;

a third gate electrode layer being another one of the plurality of gate electrode layers and disposed between the first gate electrode layer and the second gate electrode layer, the third gate electrode layer including a third region extending in the second direction, and a fourth region separated from the third region and extending in the second direction, the first semiconductor layer disposed between the third region and the fourth region;
a first charge storage layer disposed between the first semiconductor layer and the first gate electrode layer, the first charge storage layer having an annular shape on a first plane perpendicular to the first direction and including the first gate electrode layer;
a second charge storage layer disposed between the first semiconductor layer and the second region, the second charge storage layer having a horseshoe shape on a second plane perpendicular to the first direction and including the second gate electrode layer; and
a third charge storage layer disposed between the first semiconductor layer and the fourth region, the third charge storage layer having a horseshoe shape on a third plane perpendicular to the first direction and including the third gate electrode layer, wherein
a distance in a third direction perpendicular to the first direction and the second direction between the first region and the second charge storage layer is greater than a distance in the third direction between the first region and the second region,
a distance in the third direction between the third region and the third charge storage layer is equal to or greater than a distance in the third direction between the third region and the fourth region, and
a first distance in the third direction, from an end of the second region on the first region side to an end of the second charge storage layer on the first region side, is greater than a second distance in the third direction from an end of the fourth region on the third region side to an end of the third charge storage layer on the third region side.

2. The semiconductor memory device according to claim 1, wherein
the first semiconductor layer is annular on the first plane,
the first semiconductor layer has a horseshoe shape on the second plane, and
the first semiconductor layer has a horseshoe shape on the third plane.

3. The semiconductor memory device according to claim 2, wherein
a third distance in the third direction, from an end of the second region on the first region side to an end of the first semiconductor layer on the first region side, is greater than a fourth distance in the third direction, from an end of the fourth region on the third region side to an end of the first semiconductor layer on the third region side.

4. The semiconductor memory device according to claim 1, wherein
the first distance is two times or more than the second distance.

5. The semiconductor memory device according to claim 1, wherein
a distance in the third direction between the first region and the second region is greater than a distance in the third direction between the third region and the fourth region.

6. The semiconductor memory device according to claim 1, further comprising:

second insulating layers disposed between the first region and the second region, and between the third region and the fourth region, wherein in a plane parallel to the first direction and the third direction, a side surface of the second insulating layer has a stepped portion, and a first width in the third direction of the second insulating layer on the first gate electrode layer side of the stepped portion is narrower than a second width in the third direction of the second insulating layer on the second gate electrode layer side of the stepped portion.

7. The semiconductor memory device according to claim 6, wherein a first material of a first portion of the second insulating layer in contact with the second gate electrode layer is different from a second material of a second portion of the second insulating layer in contact with the third gate electrode layer.

8. The semiconductor memory device according to claim 1, further comprising:

a first conductive layer disposed in the first direction of the stacked body, is disposed with the second gate electrode layer between the first gate electrode layer and the first conductive layer, is electrically connected to the first semiconductor layer, and extends in the third direction.

9. The semiconductor memory device according to claim 1, further comprising:

a second semiconductor layer disposed in the stacked body and extending in the first direction;

a fourth charge storage layer disposed between the second semiconductor layer and the second region, and having an annular shape on the second plane; and a fifth charge storage layer disposed between the second semiconductor layer and the fourth region, and having an annular shape on the third plane.

10. The semiconductor memory device according to claim 9, wherein the second semiconductor layer is annular on the second plane, and the second semiconductor layer is annular on the third plane.

11. The semiconductor memory device according to claim 10, further comprising:

a first conductive layer disposed in the first direction of the stacked body, is disposed with the second gate electrode layer between the first gate electrode layer and the first conductive layer, is electrically connected to the first semiconductor layer and the second semiconductor layer, and extends in the third direction.

12. The semiconductor memory device according to claim 9, further comprising:

a third semiconductor layer disposed in the stacked body and extending in the first direction;

a sixth charge storage layer disposed between the third semiconductor layer and the first gate electrode layer, and having an annular shape on the first plane;

a seventh charge storage layer disposed between the third semiconductor layer and the first region, and having a horseshoe shape on the second plane; and an eighth charge storage layer disposed between the third semiconductor layer and the third region, and having a horseshoe shape on the third plane.

13. The semiconductor memory device according to claim 12, wherein the third semiconductor layer is annular on the first plane, the third semiconductor layer has a horseshoe shape on the second plane, and the third semiconductor layer has a horseshoe shape on the third plane.

14. The semiconductor memory device according to claim 1, wherein the first region and the second region are electrically isolated, and the third region and the fourth region are electrically connected.

15. The semiconductor memory device according to claim 1, wherein the first gate electrode layer is a word line for controlling an operation of a memory cell including the first semiconductor layer and the first charge storage layer, the second region is a select gate line configured to drive a select transistor including the first semiconductor layer and the second charge storage layer, and the third gate electrode layer is a dummy word line configured to control an operation of a dummy cell including the first semiconductor layer and the third charge storage layer.

* * * * *